United States Patent
Cheng et al.

(10) Patent No.: US 7,176,522 B2
(45) Date of Patent: Feb. 13, 2007

(54) SEMICONDUCTOR DEVICE HAVING HIGH DRIVE CURRENT AND METHOD OF MANUFACTURING THEREOF

(75) Inventors: Shui-Ming Cheng, Hsin-Chu (TW); Hung-Wei Chen, Hsin-Chu (TW); Zhong Tang Xuan, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/916,023

(22) Filed: Aug. 11, 2004

(65) Prior Publication Data

US 2005/0112817 A1    May 26, 2005

Related U.S. Application Data

(63) Continuation-in-part of application No. 10/722,218, filed on Nov. 25, 2003.

(51) Int. Cl.
H01L 29/76    (2006.01)

(52) U.S. Cl. .................. 257/338; 257/69; 257/204; 257/206; 257/350; 257/351; 257/357

(58) Field of Classification Search .................. 257/77, 257/220, 263, 288, 328, 339, 355, 368
See application file for complete search history.

(56) References Cited

U.S. PATENT DOCUMENTS 5,021,354 A * 6/1991 Pfiester ..................... 438/230
5,783,475 A * 7/1998 Ramaswami ................ 438/303
6,165,826 A * 12/2000 Chau et al. .................. 438/231
6,743,684 B2 * 6/2004 Liu ............................ 438/300
2005/0093021 A1 * 5/2005 Ouyang et al. ............. 257/194

OTHER PUBLICATIONS

Shimizu, A., et al., "Local Mechanical-Stress Control (LMC): A New Technique for CMOS-Performance Enhancement", IEEE, 2001, 4 pages.

* cited by examiner

Primary Examiner—Wai-Sing Louie
(74) Attorney, Agent, or Firm—Haynes and Boone, LLP

(57) ABSTRACT

A method comprises forming a first semiconductor device in a substrate, where the first semiconductor device comprises a gate structure, a spacer disposed on sidewalls of the gate structure, the spacer having a first thickness, and raised source and drain regions disposed on either side of the gate structure. The method further comprises forming a second semiconductor device in the substrate and electrically isolated from the first semiconductor device, where the second semiconductor device comprises a gate structure, a spacer disposed on sidewalls of the gate structure, the spacer having a second thickness less than the first thickness of the spacer of the first semiconductor device, and recessed source and drain regions disposed on either side of the gate structure.

15 Claims, 16 Drawing Sheets

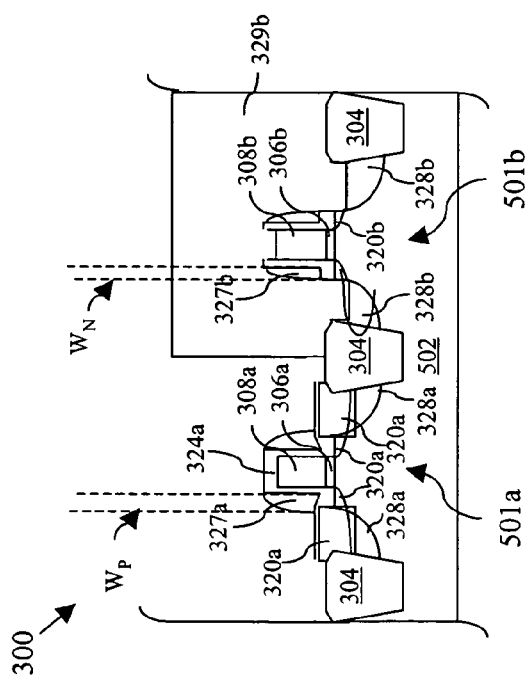
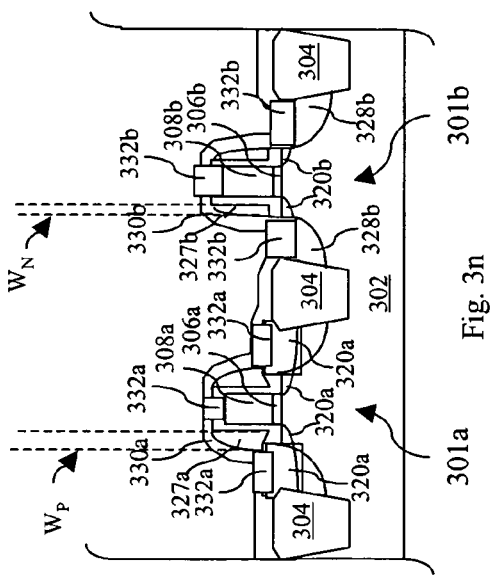
Fig. 3m
Fig. 3n

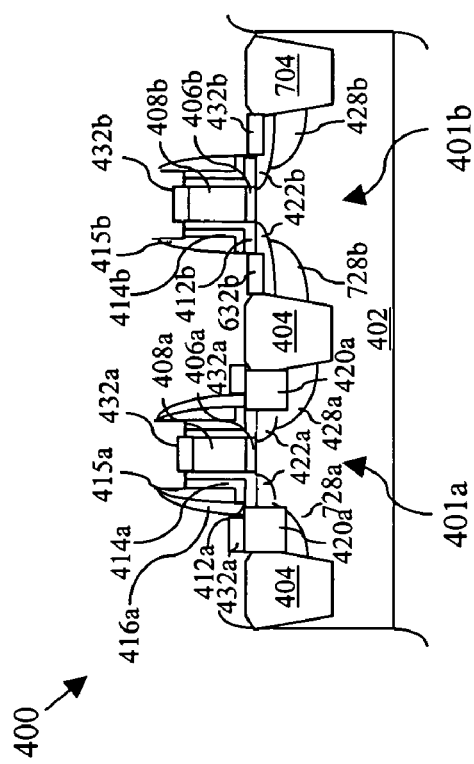
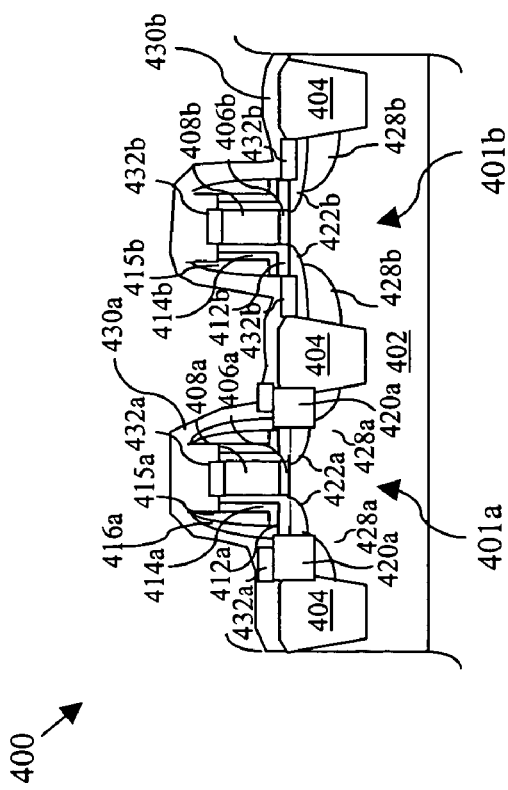
Fig. 4i
Fig. 4j

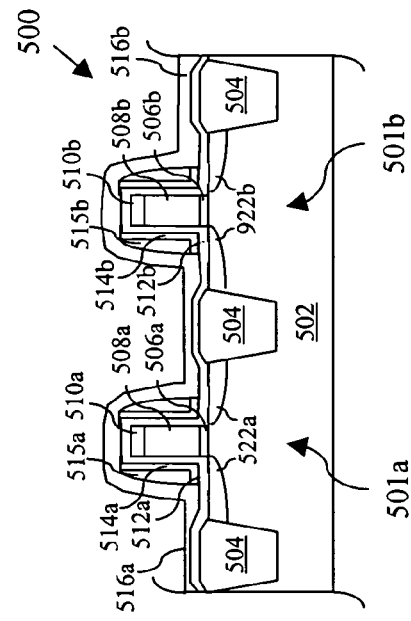
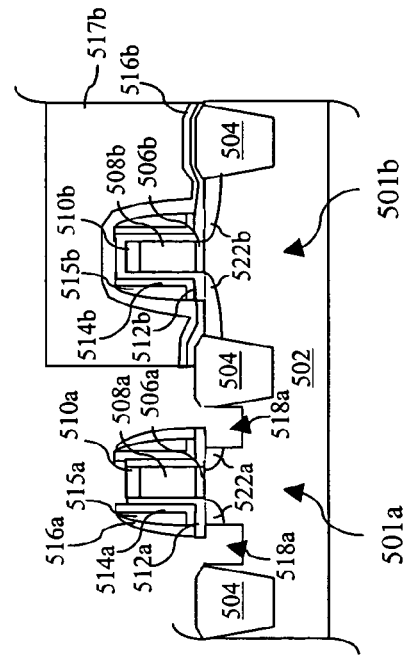
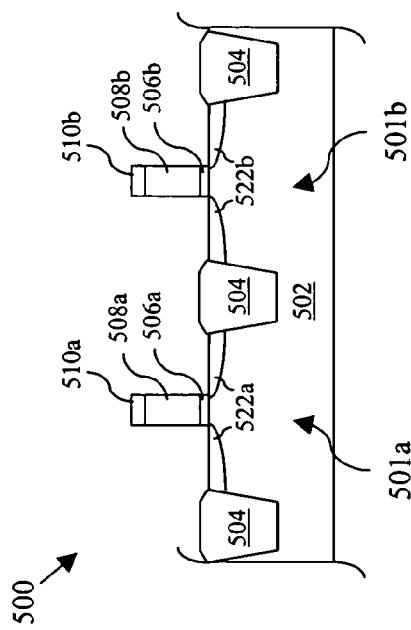
Fig. 5a
Fig. 5b
Fig. 5c
Fig. 5d

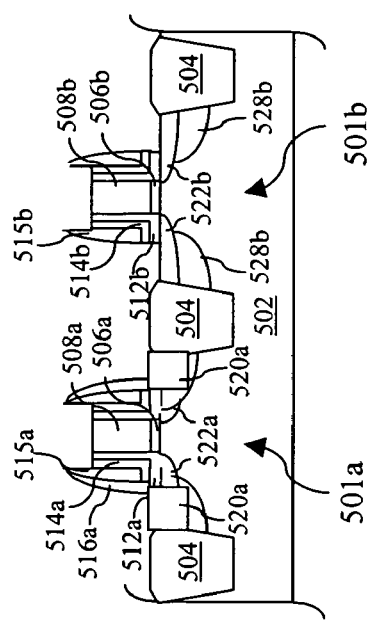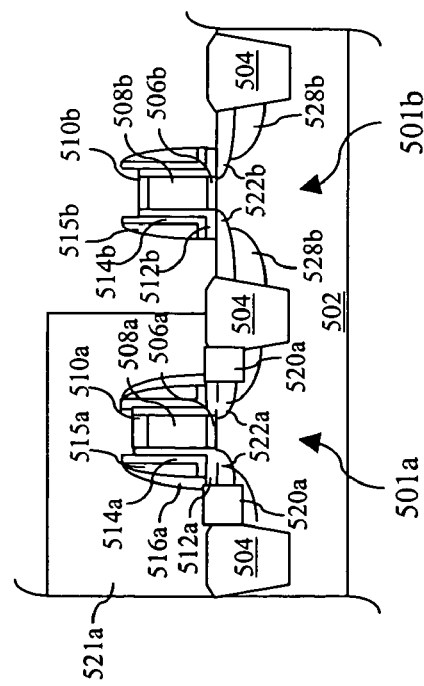
Fig. 5g
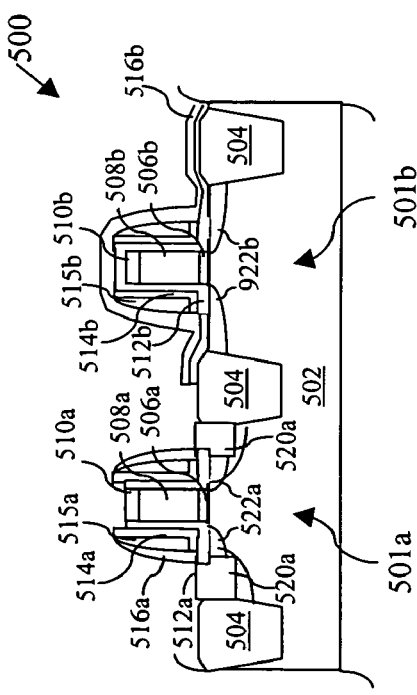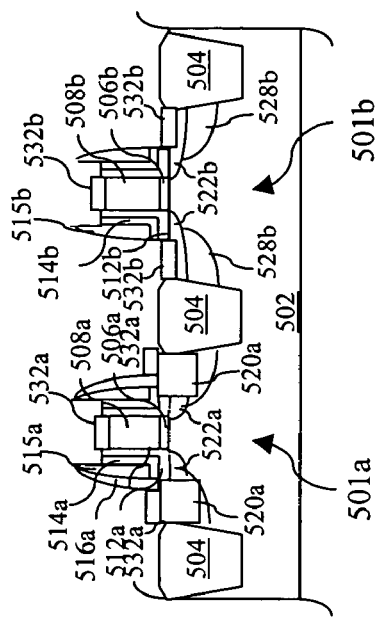
Fig. 5h
Fig. 5e
Fig. 5f

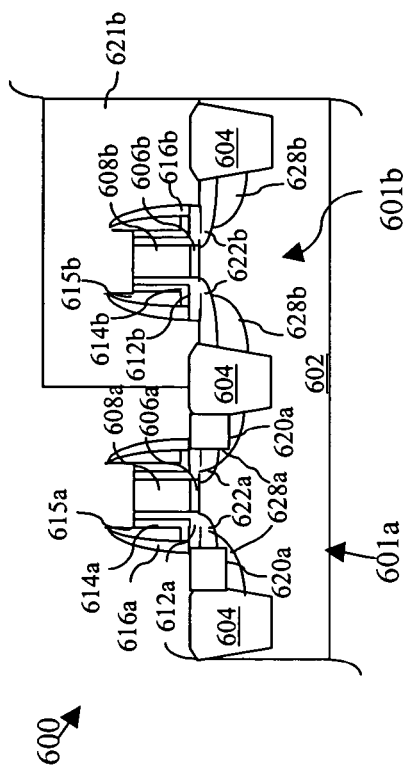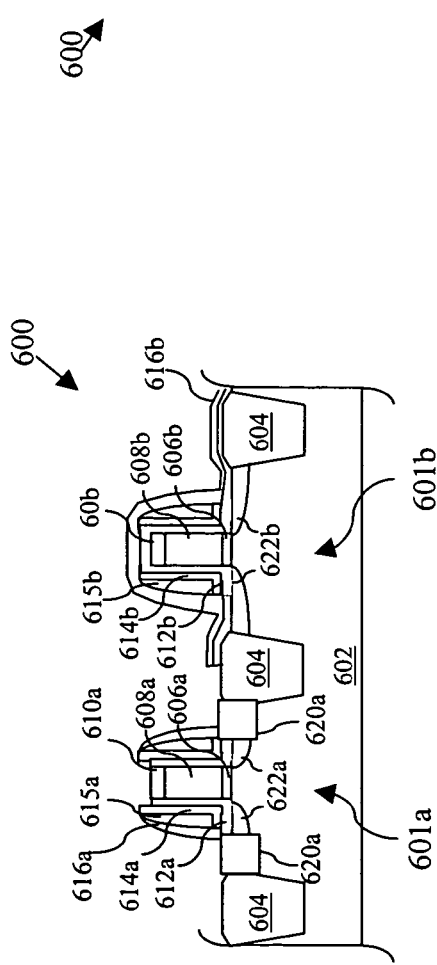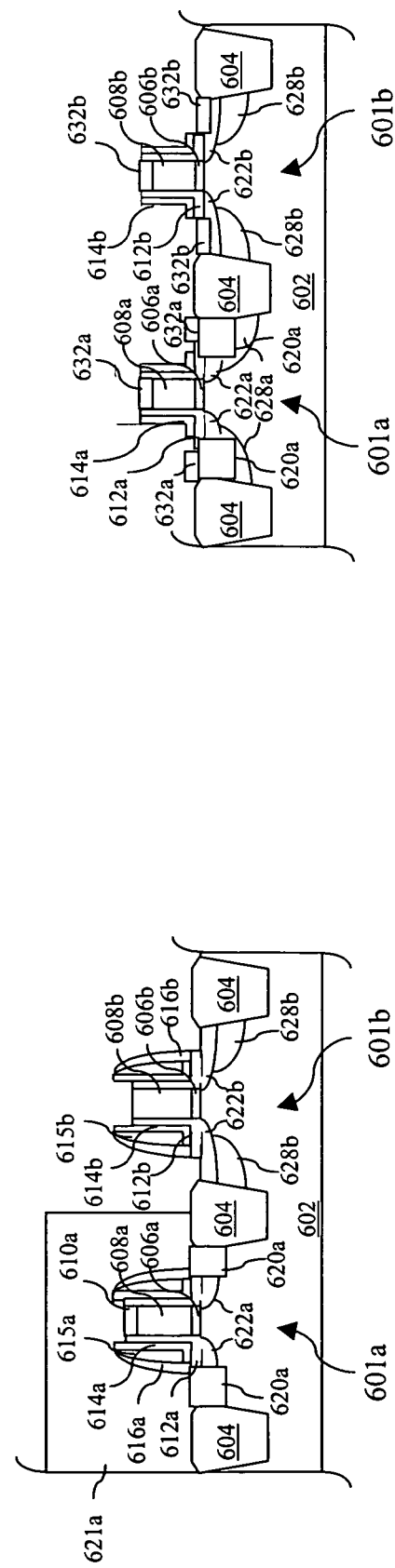
Fig. 6g
Fig. 6h
Fig. 6e
Fig. 6f

SEMICONDUCTOR DEVICE HAVING HIGH DRIVE CURRENT AND METHOD OF MANUFACTURING THEREOF

CROSS-REFERENCE

This application is a continuation-in-part application of commonly-assigned U.S. Patent Application "SEMICONDUCTOR DEVICE HAVING HIGH DRIVE CURRENT AND METHOD OF MANUFACTURE THEREFOR," Ser. No. 10/722,218, filed Nov. 25, 2003.

BACKGROUND

Increasing tensile or compressive stress in a semiconductor device substrate can improve drive current. For example, increasing the tensile stress in the substrate can improve the performance of n-channel metal-oxide-semiconductor (NMOS) devices. Similarly, increasing the compressive stress in the substrate can improve the performance of p-channel metal-oxide-semiconductor (PMOS) devices. However, such tuning of the stress in a substrate incorporating NMOS and PMOS devices, such as by increasing tensile stress in substrate regions containing NMOS devices and increasing compressive stress in substrate regions containing PMOS devices, is difficult.

Some applications have realized limited localized stress tuning by employing different materials for adjacent shallow trench isolation (STI) regions and other isolation structures. Stress tuning can also be accomplished by employing different materials for silicide and other contact layers. Etch stop layers remaining in the device structure after being employed as etching endpoints have also been employed for substrate stress tuning. However, such past attempts accomplished only increased tensile stress or increased compressive stress. That is, the performance of PMOS devices in a complimentary metal-oxide-semiconductor (CMOS) scheme were improved, or the performance of NMOS devices in the CMOS scheme were improved, but the past attempts failed to simultaneously improve device performance of both the PMOS and NMOS devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4a–4j are sectional views of another embodiment of a method of making a microelectronic device according to aspects of the present disclosure.

FIGS. 5a–i are sectional views of another embodiment of a method of making a microelectronic device according to aspects of the present disclosure.

FIGS. 6a–i are sectional views of another embodiment of a method of making a microelectronic device according to aspects of the present disclosure.

DETAILED DESCRIPTION

Figure 1:
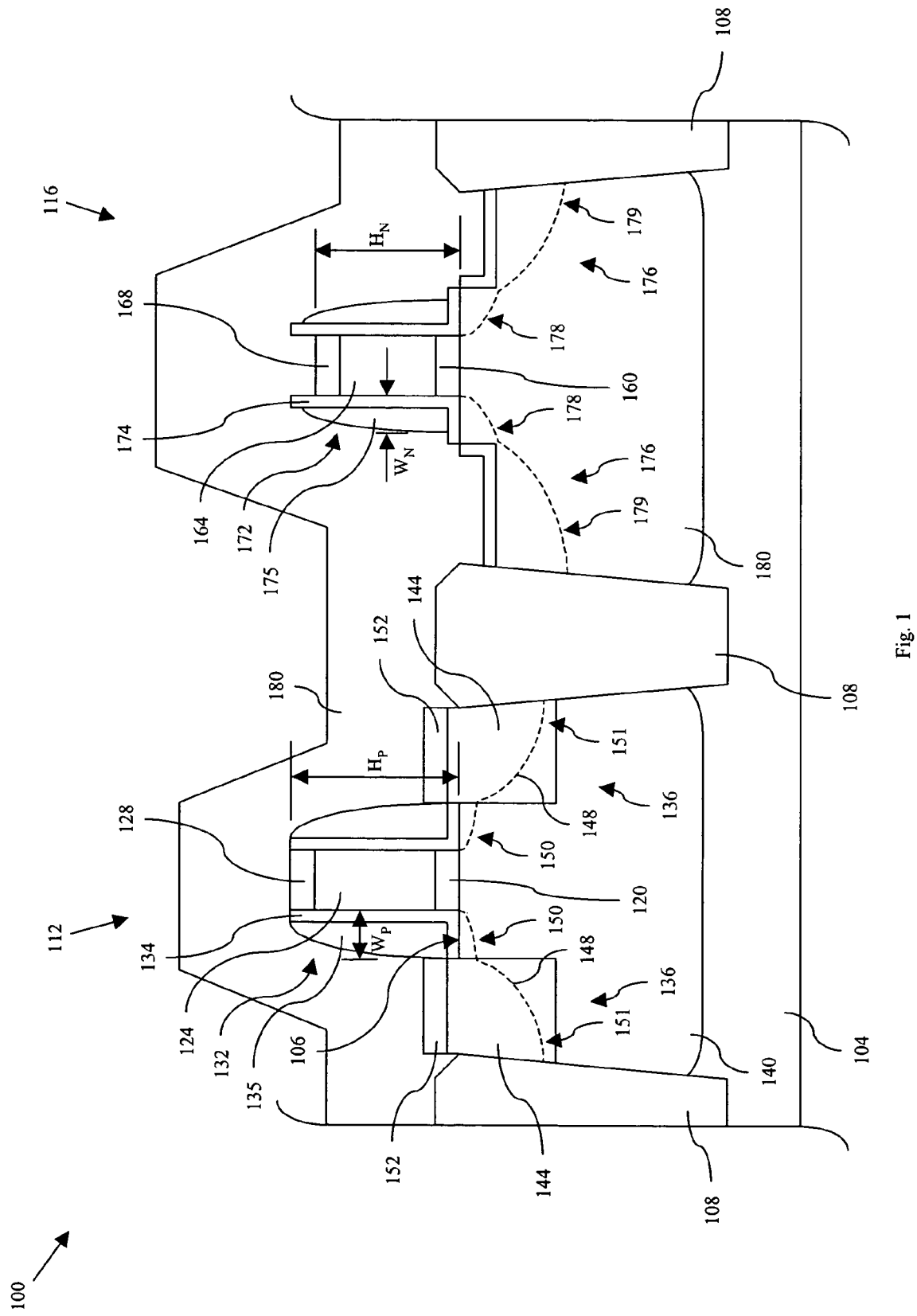
FIG. 1 is a sectional view of one embodiment of a semiconductor device constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure relates generally to semiconductor devices and, more specifically, to a semiconductor device having a high drive current, a method of manufacture thereof, and an integrated circuit device incorporating the same.

Referring to FIG. 1, illustrated is one embodiment of a semiconductor device 100 constructed according to aspects of the present disclosure. The semiconductor device 100 includes a substrate 104 having one or more isolation structures 108 formed therein. The semiconductor device 100 also includes a PMOS device 112 and an NMOS device 116 that are electrically isolated by one of the isolation structures 108.

The substrate 104 may comprise an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or any combination thereof. The substrate 104 may also comprise a semiconductor material on an insulator, such as silicon-on-insulator (SOI), or a thin film transistor (TFT). In one embodiment, the substrate 104 may also include a doped epitaxial layer. The substrate 104 may also include a multiple silicon structure or a multilayer, compound semiconductor structure. Although not limited within the scope of the present disclosure, the channel direction of the substrate 104 in some embodiments may be <100> or <110> and the crystalline orientation of the substrate 104 in some embodiments may be (100) or (110) or (111).

The isolation structures 108 may be formed by local oxidation of silicon (LOCOS), shallow trench isolation (STI) and/or other processes. For example, the isolation structures 108 may be formed by etching or otherwise patterning recesses in the substrate 104 and subsequently filling the recesses with silicon dioxide and/or other electrically insulating materials, possibly by chemical vapor deposition.

The PMOS device 112 includes a gate dielectric layer 120 over the substrate 104, a gate electrode 124 over the gate dielectric layer 120, and possibly a gate contact 128 over the gate electrode 124. The PMOS device 112 also includes spacers 132 on opposing sides of the gate electrode 124 and over the substrate 104, and source/drain regions 136 on opposing sides of the gate electrode 124 and at least partially within the substrate 104. The PMOS device 112 may also include or be at least partially formed in an n-doped region 140 of the substrate 104. The n-doped region 140 may be formed by ion implantation of phosphorous, antimony, arsenic and/or other impurities or dopants.

The gate dielectric layer 120 may be formed by thermal oxidation, atomic layer deposition (ALD), chemical vapor deposition (CVD), physical vapor deposition (PVD), plasma enhanced CVD (PECVD) and/or other processes. Moreover, although not limited by the scope of the present disclosure, the gate dielectric layer 120 may comprise silicon oxide, silicon oxynitride, or a high-k dielectric, such as hafnium oxide, zirconium oxide, aluminum oxide, a hafnium dioxide-alumina (HfO2-Al2O3) alloy, and/or combinations thereof. The gate dielectric layer may have a thickness ranging between about 0.5 nm and about 10 nm.

The gate electrode 124 may be formed by CVD, PVD, PECVD, ALD and/or other processes, and may comprise doped polysilicon, silicon and germanium polysilicon, titanium nitride, tantalum nitride, nickel silicide, cobalt silicide, silicided polysilicon and/or other metals. The height of gate electrode 124 may range between about 10 nm and about 200 nm. After forming the gate electrode 124 (and possibly other subsequent process steps), the gate electrode 124 may also be processed to form an ohmic contact, such as the gate contact 128 discussed above. The gate contact 128 may be formed by CVD, PVD, salicidation and/or other processes, and may comprise nickel silicide, cobalt silicide, tungsten silicide, tantalum silicide, titanium silicide, platinum silicide, erbium silicide, palladium silicide and/or combinations thereof. The gate dielectric layer 120 and the gate electrode 124, and possibly the gate contact 128, collectively have a combined height $H_P$ above a surface 106 of the substrate 104.

The spacers 132 may be formed by CVD, PVD, thermal oxidation and/or other processes, and may comprise one or more dielectric materials such as silicon nitride, silicon oxide, silicon carbide, silicon oxynitride and/or combinations thereof. The spacers 132 may each have a width $W_P$ extending from the gate electrode 124. The width of spacers 132 may range between about 5 nm and about 100 nm.

The spacers 132 may also comprise more than one layer. For example, as in the illustrated embodiment, the spacers 132 may comprise stacked first and second layers 134, 135. The first layer 134 may conform to a portion of the substrate 104 and one side of the stack formed by the gate dielectric layer 120, the gate electrode 124 and possibly the gate contact 128. The second layer 135 may be substantially bound by the first layer 134. Of course, the spacers 132 may comprise other layers in addition to and/or as an alternative to those described herein.

The source/drain regions 136 may be of conventional composition and fabrication. For example, the source/drain regions 136 may comprise doped portions of the substrate 104 which may be formed by ion implantation of boron, boron difluoride (BF2), or other dopants, and/or in-situ doped of boron or other dopants. In such embodiments, the source/drain regions 136 may be substantially coplanar with the surface 106 of the substrate 104. However, as in the illustrated embodiment, the source/drain regions 136 may extend above the substrate surface 106. In such embodiments, the source/drain regions 136 may comprise silicon, silicon germanium, silicon carbide, gallium arsenide and/or other materials, and may be formed by dry etching or otherwise patterning recesses in the substrate 104 and subsequently filling the recesses with such materials. For example, the recess may be epitaxially filled with silicon germanium, possibly by exposing the recesses to a precursor comprising germanium. The filled recesses are herein designated by the reference numeral 144. The depth of recessed source/drain region may range between about 5 nm and about 100 nm. Moreover, as in the illustrated embodiment, the recesses 144 may be filled to a height above the surface 106 of the substrate 104, such that the source/drain regions 136 may be raised source/drain regions. The height of raised source/drain regions may range between about 5 nm and about 100 nm.

The doping processes discussed above that may be employed to form the source/drain regions 136 may also be performed after the filled recesses 144 are formed, or simultaneous with forming the filled recesses 144, thereby forming a doping profile 148 further optimizing the conductivity of the source/drain regions 136. Moreover, such a doping profile 148 may be accomplished in more than one doping procedure. For example, as in the illustrated embodiment, the doping profile 148 may include lightly doped regions 150 adjacent the spacers 132 and heavier doped regions 151 within the filled recesses 144, wherein the lightly doped regions 150 may be formed by a first doping process and the heavier doped regions 151 may be formed by a second, subsequent doping process. The lightly doped regions 150 may be formed by implanting boron, boron diflourine (BF$_2$), and/or other dopants. The energy of ion implantation of boron may range between about 0.2 keV and about 20 keV and the dose may range between about $5 \times 10^{14}$ and about $5 \times 10^{15}$ cm$^{-2}$. The heavier doped regions 151 may be formed by ion implantation or in-situ doped of boron, boron difluoride (BF$_2$), and/or other dopants. The energy of ion implant of boron may range between about 0.2 keV are about 50 keV and the dose of ion implantation of boron may range between about $1 \times 10^{15}$ and about $5 \times 10^{15}$ cm$^{-2}$.

After their formation, the source/drain regions 136 may also be processed to form contacts 152 thereon. The contacts 152 may be substantially similar in composition and manufacture to the gate contact 128, and may be formed simultaneously with the gate contact 128.

The NMOS device 116 includes a gate dielectric layer 160 over the substrate 104, a gate electrode 164 over the gate dielectric layer 160, and possibly a gate contact 168 over the gate electrode 164. The NMOS device 116 also includes spacers 172 on opposing sides of the gate electrode 164 over the substrate 104, and source/drain regions 176 on opposing sides of the gate electrode 164 at least partially within the substrate 104. The NMOS device 116 may also include or be at least partially formed in a p-doped region 180 of the substrate 104. The p-doped region 180 may be formed by ion implantation of boron, boron difluoride (BF$_2$), indium and/or other impurities or dopants.

The gate dielectric layer 160, gate electrode 164 and gate contact 168 are substantially similar in composition and manufacture to the gate dielectric layer 120, gate electrode 124 and gate contact 128. In one embodiment, the gate dielectric layers 120, 160 are formed simultaneously, the gate electrodes 124, 164 are formed simultaneously, and the gate contacts 128, 168 are formed simultaneously. However, in one embodiment, the gate dielectric layer 160 and the gate electrode 164, and possibly the gate contact 168, have a combined height $H_N$ above the surface 106 of the substrate 104. The height $H_N$ may be substantially equal to the combined height $H_P$ discussed above. However, in one embodiment, the height $H_N$ may be substantially less than the combined height $H_P$. For example, the height $H_N$ may be at least 10–20% less than the height $H_P$. In one embodiment, the height $H_N$ is 30% less than the height $H_P$. In another embodiment, the height $H_N$ may be substantially greater than the combined height $H_P$. For example, the height $H_N$ may be at least 10–20% greater than the height $H_P$. In one embodiment, the height $H_N$ is 30% greater than the height $H_P$.

The spacers 172 are substantially similar in composition and manufacture to the spacers 132, and may be formed simultaneously with the spacers 132. For example, the spacers 172 may comprise a first layer 174 at least spanning the height $H_N$ and a portion of the substrate surface 106, and a second layer 175 substantially bound by the first layer 174. The spacers 172 have a width $W_N$ extending from the gate electrode 164 that is substantially equal to the width $W_P$ of the spacers 132. However, in one embodiment, the spacers 172 have a width $W_N$ that is substantially less than the width $W_P$ of the spacers 132. For example, the width $W_N$ may be at least 10-20% less than the width $W_P$. In one embodiment, the width $W_N$ is 50% less than the width $W_P$. In another embodiment, the spacers 172 have a width $W_N$ that is substantially greater than the width $W_P$ of the spacers 132. For example, the width $W_N$ may be at least 10-20% greater than the width $W_P$. In one embodiment, the width $W_N$ is 50% greater the width $W_P$.

The source/drain regions 176 may be substantially similar in composition and manufacture to the source/drain regions 136. However, as in the illustrated embodiment, the source/drain regions 176 may be recessed source/drain regions. That is, the source/drain regions 176 may be formed by dry etching or otherwise patterned recesses in the substrate 104 prior to performing the ion implantation or other processes employed to form a doping profile. The source/drain regions 176 may also have a doping profile that is similar to the doping profile of the source/drain regions 136, in that the source/drain regions 176 may include lightly doped regions 178 and heavily doped regions 179. The lightly doped regions 178 may be formed by implanting arsenic, phosphorous, antimony, and/or other dopants. The energy of ion implantation of arsenic may range between about 0.5 KeV and about 10 KeV and the dose may range between about $5 \times 10^{14}$ and about $5 \times 10^{15}$ cm$^{-2}$. The heavier doped regions 179 may be formed by ion implantation or in-situ doped of arsenic, phosphorous, antimony, and/or other dopants. The energy of ion implant of arsenic may range between about 5 keV and about 50 keV and the dose of ion implantation of boron may range between about $1 \times 10^{15}$ and about $5 \times 10^{15}$ cm$^{-2}$.

In one embodiment, the source/drain regions 136 may be recessed source/drain regions and the source/drain regions 176 may be raised source/drain regions, in contrast to the illustrated embodiment. In another embodiment, the source/drain regions 136 may be recessed source/drain regions and the source/drain regions 176 may be coplanar with the substrate 104. In another embodiment, the source/drain regions 136 may be raised source/drain regions and the source/drain regions 176 may be coplanar with the substrate 104. In another embodiment, the source/drain regions 176 may be recessed source/drain regions and the source/drain regions 136 may be coplanar with the substrate 104. In another embodiment, the source/drain regions 176 may be raised source/drain regions and the source/drain regions 136 may be coplanar with the substrate 104.

The semiconductor device 100 may also include an etch stop layer 180. The etch stop layer 180 may comprise silicon nitride (e.g., Si3N4), silicon oxynitride (e.g., SiON), silicon carbide, silicon dioxide and/or other materials, and may be formed by blanket or selective deposition by CVD, PVD, thermal oxidation and/or other processes. The etch stop layer 180 may be a tensile or compressive film, wherein a stress level may range between about +0.01 and about +2 GPa for tensile film and between about −0.01 and about −2 GPa for compressive film. The tensile or compressive nature of the etch stop layer 180 may impart strain within the source/drain regions 136, 176. Moreover, the strain induced in the source/drain region 136 by the etch stop layer 180 may be substantially different in magnitude that the strain induced in the source/drain region 176 by the etch stop layer 180. For example, the strain induced in the source/drain regions 136, 176 may vary by 10–20% in magnitude. In one embodiment, the strain induced in the source/drain regions 136 may be tensile and the strain induced in the source/drain regions 176 may be compressive. In another embodiment, the strain induced in the source/drain regions 136 may be compressive and the strain induced in the source/drain regions 176 may be tensile. The thickness of etch stop layer 180 may range between about 5 nm and about 200 nm.

Figure 2:
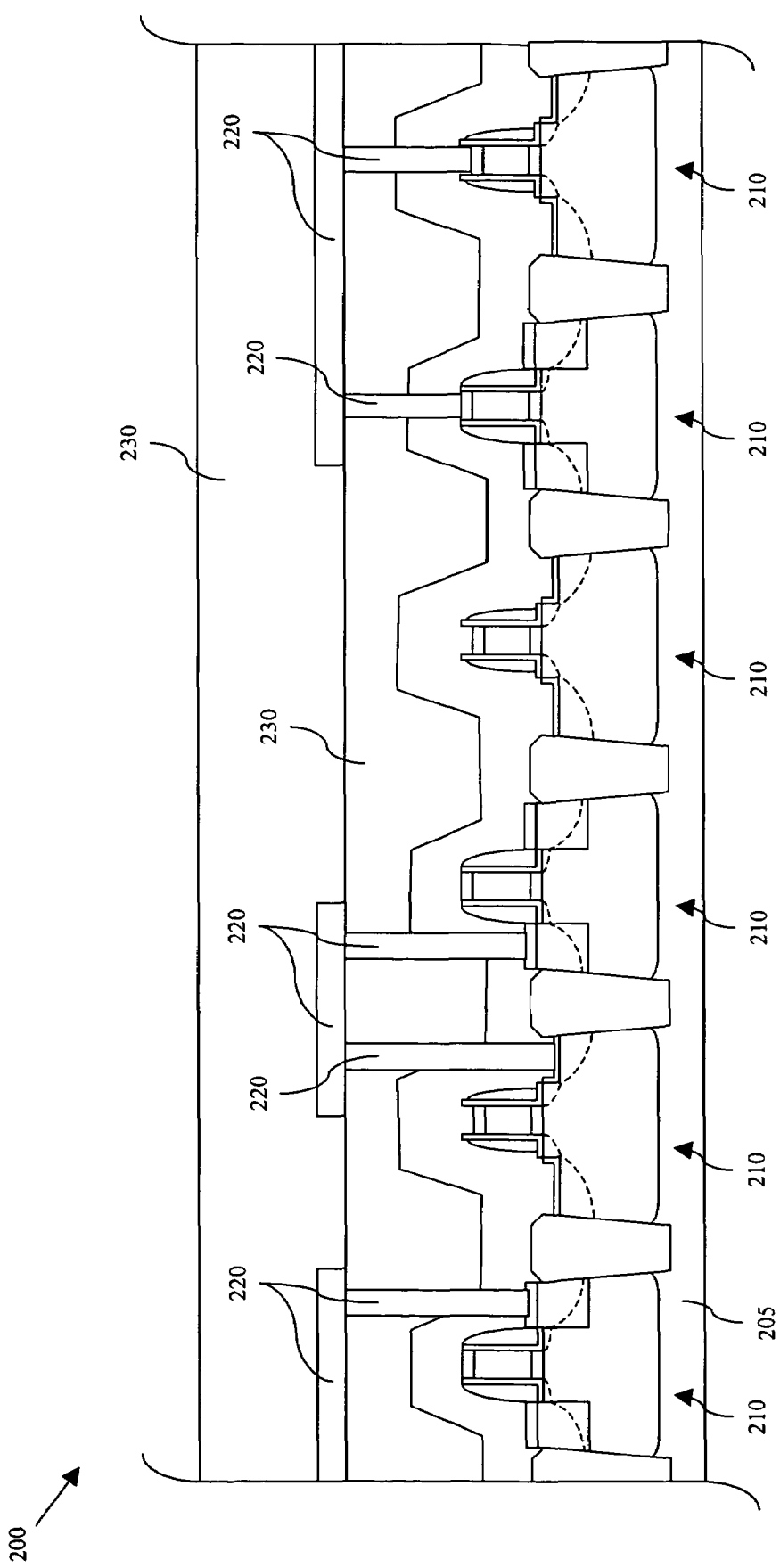
FIG. 2 is a sectional view of one embodiment of an integrated circuit device constructed according to aspects of the present disclosure.

Referring to FIG. 2, illustrated is one embodiment of an integrated circuit device 200 constructed according to aspects of the present disclosure. The integrated circuit device 200 is one environment in which embodiments of the semiconductor device 100 shown in FIG. 1 may be implemented. For example, the integrated circuit device 200 includes a plurality of semiconductor devices 210, ones of which may be substantially similar to the semiconductor device 100 shown in FIG. 1. The semiconductor devices 210 may form a logic circuit or other transistor array, including a one-, two- or three-dimensional array, and may be oriented in one or more rows and/or one or more columns, such as on or over a substrate 205 in which the substrate 205 is substantially planar. In one environment, the substrate 205 may be substantially spherical or have a spherical or otherwise rounded surface on, over or from which the plurality semiconductor devices 210 may be formed.

The integrated circuit device 200 also includes interconnects 220 extending along and/or through one or more dielectric layers 230 to ones of the plurality of semiconductor devices 210. The dielectric layer 230 may comprise silicon dioxide, fluoride-doped silicate glass (FSG), Black Diamond® (a product of Applied Materials of Santa Clara, Calif.), Xerogel, Aerogel, amorphous fluorinated carbon, Parylene, BCB, Flare, and SiLK, and/or other materials, and may be formed by CVD, PECVD, ALD, PVD, spin-on coating and/or other processes. The interconnects 220 may comprise copper, tungsten, gold, aluminum, carbon nanotubes, carbon fullerenes, refractory metals, alloys of these materials and/or other materials, and may be formed by CVD, PECVD, ALD, PVD and/or other processes. The interconnects 220 may also include more than one layer. For example, each interconnect 220 may comprise an adhesion layer possibly comprising titanium, titanium nitride, tantalum or tantalum nitride, a barrier layer possibly comprising titanium nitride or tantalum nitride, and a bulk conductive layer comprising copper, tungsten, aluminum, or aluminum alloy.

Thus, the present disclosure introduces a semiconductor device including, in one embodiment, an isolation region located in a substrate, an NMOS device located partially over a surface of the substrate, and a PMOS device isolated from the NMOS device by the isolation region and located partially over the surface. A first one of the NMOS and PMOS devices includes one of: (1) first source/drain regions recessed within the surface; and (2) first source/drain regions extending from the surface. A second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface.

In another embodiment, semiconductor device constructed according to aspects of the present disclosure comprises an isolation region located in a substrate, an NMOS device located partially over a surface of the substrate, and a PMOS device isolated from the NMOS device by the isolation region and located partially over the surface. A first one of the NMOS and PMOS devices includes: (1) first source/drain regions located at least partially in the substrate; and (2) a first gate interposing the first source/drain regions and having a first gate height over the surface. A second one of the NMOS and PMOS devices includes: (1) second source/drain regions located at least partially in the substrate; and (2) a second gate interposing the second source/drain regions and having a second gate height over the surface, wherein the first and second gate heights are substantially different.

Another embodiment of a semiconductor device constructed according to aspects of the present disclosure includes an isolation region located in a substrate, an NMOS device located partially over a surface of the substrate, and a PMOS device isolated from the NMOS device by the isolation region and located partially over the surface. A first one of the NMOS and PMOS devices includes: (1) first source/drain regions located at least partially in the substrate; (2) a first gate interposing the first source/drain regions; and (3) first spacers on opposing sides of the first gate and each extending from the first gate to a first width. A second one of the NMOS and PMOS devices includes: (1) second source/drain regions located at least partially in the substrate; (2) a second gate interposing the second source/drain regions; and (3) second spacers on opposing sides of the second gate and each extending from the second gate to a second width, wherein the first and second widths are substantially different.

In another embodiment, a semiconductor device constructed according to aspects of the present disclosure includes an isolation region located in a substrate, an NMOS device located partially over a surface of the substrate, and a PMOS device isolated from the NMOS device by the isolation region and located partially over the surface. A first one of the NMOS and PMOS devices includes one of: (1) first source/drain regions located at least partially within the substrate and comprising SiC; and (2) first source/drain regions located at least partially within the substrate and comprising SiGe. A second one of the NMOS and PMOS devices includes one of: (1) second source/drain regions located at least partially within the substrate and comprising SiC wherein the first source/drain regions comprise SiGe; (2) second source/drain regions located at least partially within the substrate and comprising SiGe wherein the first source/drain regions comprise SiC; and (3) second source/drain regions located at least partially within the substrate and substantially not comprising either of SiC and SiGe.

The present disclosure also introduces a method of manufacturing semiconductor device. In one embodiment, the method includes forming an isolation region located in a substrate, forming an NMOS device located partially over a surface of the substrate, and forming a PMOS device isolated from the NMOS device by the isolation region and located partially over the surface. A first one of the NMOS and PMOS devices includes one of: (1) first source/drain regions recessed within the surface; and (2) first source/drain regions extending from the surface. A second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface.

An integrated circuit device is also provided in the present disclosure. In one embodiment, the integrated circuit device includes a plurality of semiconductor devices each including an isolation region located in a substrate, an NMOS device located partially over a surface of the substrate, and a PMOS device isolated from the NMOS device by the isolation region and located partially over the surface. In each of ones of the plurality of semiconductor devices, a first one of the NMOS and PMOS devices includes one of: (1) first source/drain regions recessed within the surface; and (2) first source/drain regions extending from the surface. In each of the ones of the plurality of semiconductor devices, a second one of the NMOS and PMOS devices includes one of: (1) second source/drain regions recessed within the surface wherein the first source/drain regions extend from the surface; (2) second source/drain regions extending from the surface wherein the first source/drain regions are recessed within the surface; and (3) second source/drain regions substantially coplanar with the surface. The integrated circuit device also includes a plurality of interconnects connecting ones of the plurality of semiconductor devices.

Figure 3C:
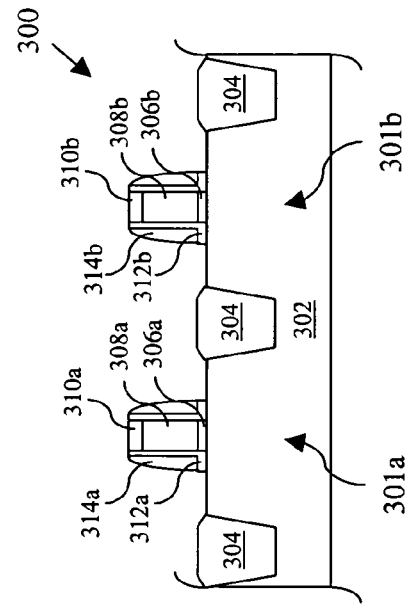
FIGS. 3a–3n are sectional views of one embodiment of a method of making a microelectronic device according to aspects of the present disclosure.
Figure 3D:
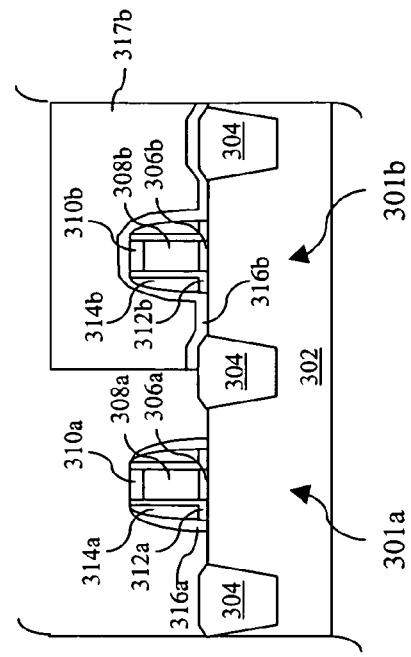
Figure 3A:
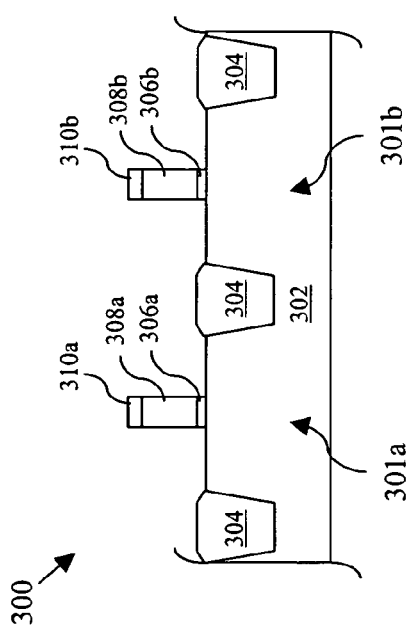

Referring to FIGS. 3a–3n, sectional views of an embodiment of a method of making semiconductor devices 301a and 301b with high drive current are shown. In the example described below, the semiconductor device 301a is a p-type MOS device and the semiconductor device 301b is an n-type MOS device. In FIG. 3a, gate dielectric 306a and 306b are formed over a substrate 302 for devices 301a and 301b, respectively, and electrically isolated from one another by isolation structures 304. The isolation structures 304 may be shallow trench isolation (STI) structures. Gate electrodes 308a and 308b are formed over the gate dielectric layer, and hard masks 310a and 310b are formed over the gate electrodes 308a and 308b, respectively.

The substrate 302 may include silicon, silicon-on-insulation (SOI), germanium, germanium-on-insulation (GOI), gallium arsenide (GaAs), strained silicon, diamond, and/or other materials. In one embodiment, the substrate 302 may be substantially similar to the substrate 104 and 205 described above. In another embodiment, the substrate 302 may include an air gap as insulation. For example, devices 301a and 301b may comprise a "silicon-on-nothing" (SON) structure having a thin insulation layer formed by air and/or other insulator.

The gate dielectric 306a and 306b and the gate electrode 308a and 308b may be substantially similar in composition to the gate dielectric layer 120 and 160 and the gate electrode 124 and 164 shown in FIG. 1. Alternatively, the gate dielectric 306a and 306b and/or gate electrode 308a and 308b may include multiple layers such as an oxide layer, a high-k dielectric later, a polysilicon layer, amorphous silicon, strained silicon, silicon germanium, silicon carbide, and/or other material layers. Other materials for the gate dielectric 306a and 306b and the gate electrode 308a and 308b may include titanium (Ti), tantalum (Ta), molybdenum (Mo), cobalt (Co), tungsten (W), titanium nitride (TiN), tantalum nitride (TaN), tungsten nitride (WN), molybdenum silicide (MoSi), tungsten silicide (WSi), cobalt silicide (CoSi), nickel silicide (NiSi$_x$), metal silicides, germanium nanowire, silicon nanowire, and/or other materials. The gate dielectric 306a and 306b may comprise a SiO$_2$ layer and/or nitrided SiO$_2$. In one embodiment, the high-k layer may be formed from a variety of different materials, such as tantalum nitride, titanium nitride, tantoxide (Ta$_2$O$_5$), hafnium dioxide (HfO$_2$), zirconium dioxide (ZrO$_2$), hafnium silicon oxy-nitride (HfSiON), hafnium silicide (HfSi$_x$), hafnium silicon nitride (HfSi$_x$N$_y$), hafnium aluminum dioxide (HfAlO$_2$), nickel silicide (NiSi$_x$), and/or other suitable materials using ALD, CVD, PECVD, evaporation, and/or other methods. With some materials, such as HfSiON, the high-k layer of gate electrode 308a and 308b may be blanket deposited on the surface of the substrate 302, while other materials may be selectively deposited. Alternatively, it may be desirable to blanket deposit some materials, including HfSiON, in some fabrication processes, while selectively depositing the same materials in other processes.

The hard masks 310a and 310b may include silicon dioxide (SiO$_2$), silicon nitride (Si$_x$N$_y$), silicon oxy-nitride (SiON), titanium nitride (TiN), silicon carbide (SiC), carbide, low-k dielectric, air, and/or other materials. The hard mask 310a and 310b may be formed by lithography, plasma etch, rapid thermal oxidation (RTO), CVD, PECVD, ALD, PVD, and/or processing techniques.

Figure 3B:
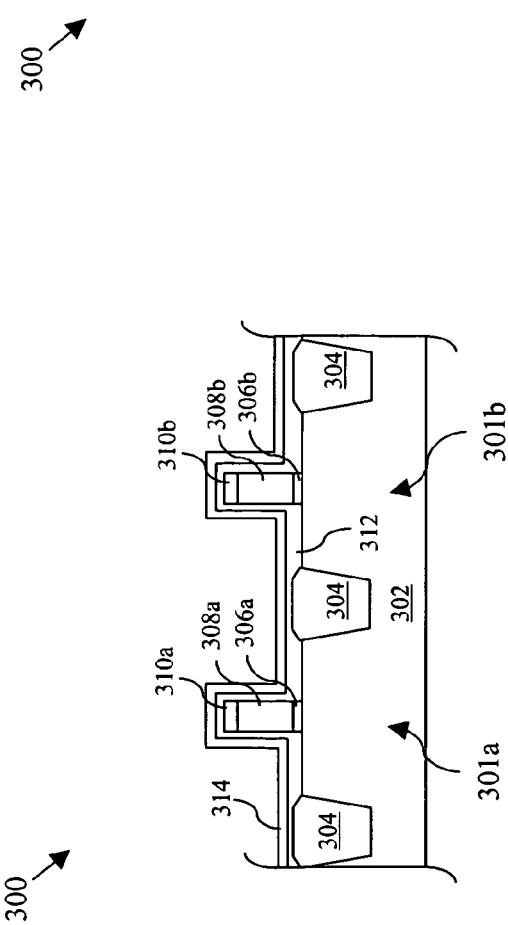

In FIG. 3b, a dielectric layer 312 is formed over the gate structures, and a gate spacer layer 314 is formed over the dielectric layer 312. The dielectric layer 312 and gate spacer layer 314 are then modified to form gate sidewall dielectric 312a and 312b, and spacers 514a and 514b, as shown in FIG. 3d. The gate sidewall dielectric 312a and 312b and/or spacers 314a and 314b may include dielectric materials such as thermal oxide, tetraethylorthosilicate (TEOS) oxide, silicon dioxide (SiO$_2$), silicon nitride (Si$_x$N$_y$), silicon oxy-nitride (SiON), silicon carbide (SiC), silicon oxy-carbide (SiOC), low-k dielectric, polymer and/or other materials. The dielectric layer 312 and gate spacer layer 314 may be formed by known methods such as deposition. A dummy spacer layer (316a and 316b) is then formed over the semiconductor device(s) 301a and 301b and etched in the device 301a using a photoresist 517 over device 301b. The dummy spacer layer may include silicon dioxide (SiO$_2$), silicon nitride (Si$_x$N$_y$), silicon oxy-nitride (SiON), low-k dielectric, polymer, air, and/or other materials. The dummy spacer material 316b may substantially cover the sidewall of the spacers 314b of the device 301b and a portion of the gate sidewall dielectric 312a of the device 301a. The dummy spacer material 316b may be formed by thermal oxidation, RTO, ALD, PDL, CVD, PVD, PECVD, spin-on coating, and/or other processing techniques.

Figure 3G:
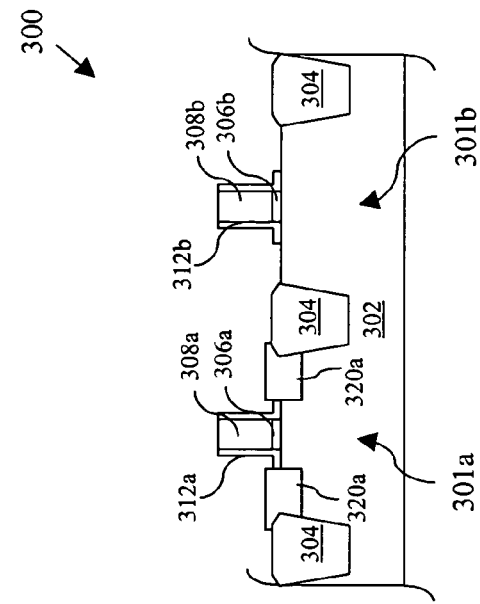
Figure 3H:
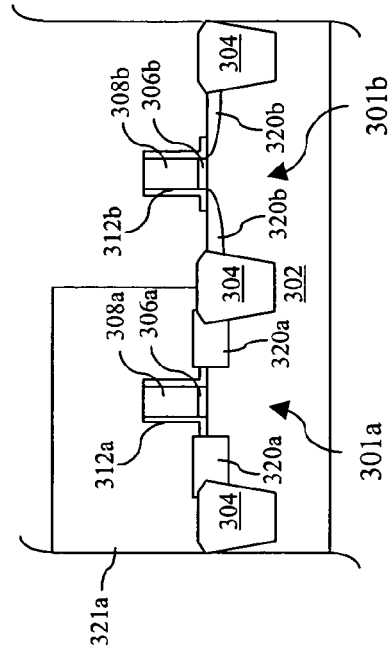
Figure 3E:
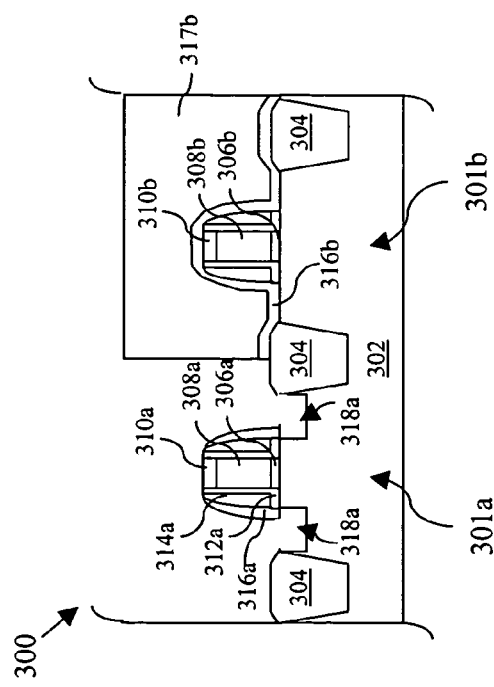
Figure 3F:
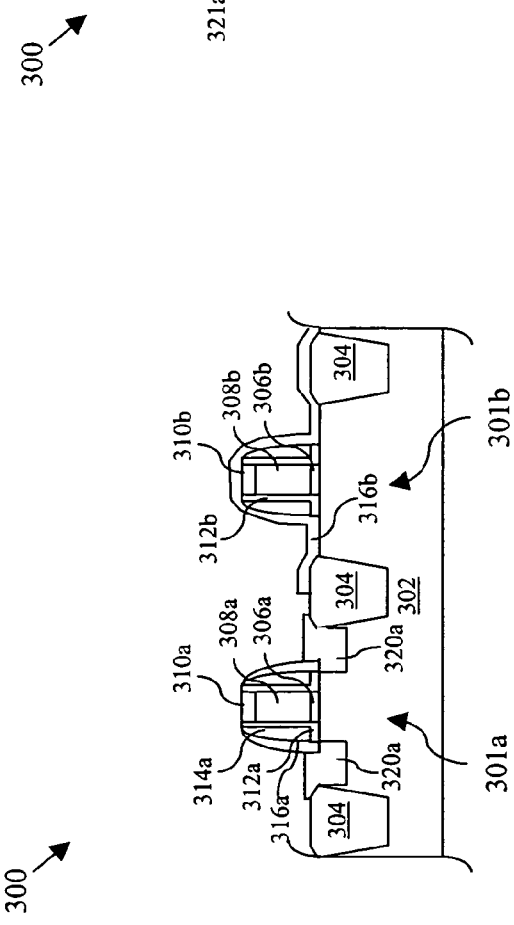

In FIG. 3e, source and drain recesses 318a are formed in the substrate 302 located on either side of the gate structure of the device 301a. The recesses 518a may be formed by a process such as chemical etch, focused ion beam (FIB), and/or plasma etch. For example, the recesses 318a may be formed by a chemical etch of the exposed substrate interposed by the isolation regions 304 and the spacers 316a. In one embodiment, a portion of the substrate 302 may be etched located below the spacer 316a. In FIG. 3f, raised source and drain regions 320a are formed or built-up in the recesses 318a. For example, the source and drain regions 320a may be formed by selective epitaxial growth (SEG), CVD, PECVD, PVD, PDL, ALD, spin-on formation, and/or other techniques. The source and drain regions 320a may include materials such as amorphous silicon, polysilicon, strained silicon, germanium, silicon germanium, silicon carbide, and/or other materials.

In FIG. 3g, the spacers 514a and 514b, dummy spacer 316a, and dummy material 316b are removed from the semiconductor device(s) 301a and 301b. The spacers 314a and 314b, dummy spacer 316a, and dummy material 316b may be removed by chemical etch, focused ion beam (FIB), plasma etch, CMP, and/or other processing techniques now known or later developed. Further, the hard masks 310a and 310b are removed from both devices 301a and 301b, respectively. In prior processes, the hard masks of the two devices are typically removed at different steps in the fabrication process. The hard masks 310a and 310b may be removed by plasma etch and/or chemical etch in an oxygen (O$_2$) containing plasma environment, for example.

Referring to FIG. 3h, the device 301a is protected by a photoresist 321a while source and drain regions 320b are formed for the device 301b are formed on either side of its gate structure. In FIG. 3i, the photoresist 321a is removed and a photoresist 321b is used to protect the device 301b while lightly doped drain regions 320a are formed for the device 301a. It may be suitable for the devices 301a and 301b to include lightly doped drains (LLD) and/or heavily doped regions. The source and drain regions 320a and 320b may include N-type and/or P-type impurities and may be formed by ion implantation and/or thermal diffusion. The impurities may include phosphorous, boron, antimony, arsenic, and/or other materials. For example, the ion implantation may include an ion implant energy ranging between about 1 KeV and about 100 KeV and the dose of ion implantation of may range between about $1 \times 10^{14}$ cm$^{-2}$ and about $5 \times 10^{18}$ cm$^{-2}$.

Figure 3K:
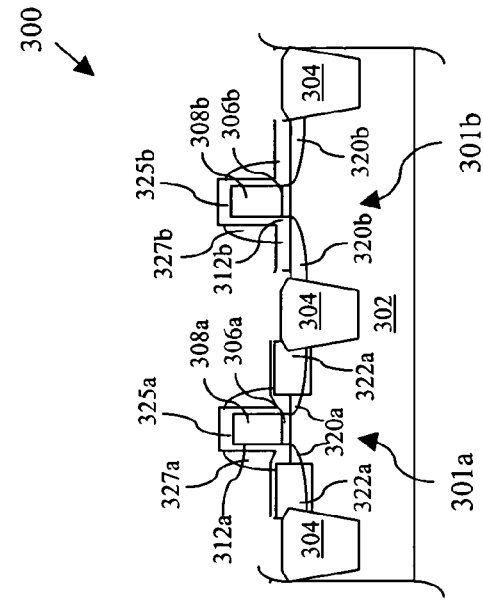
Figure 3L:
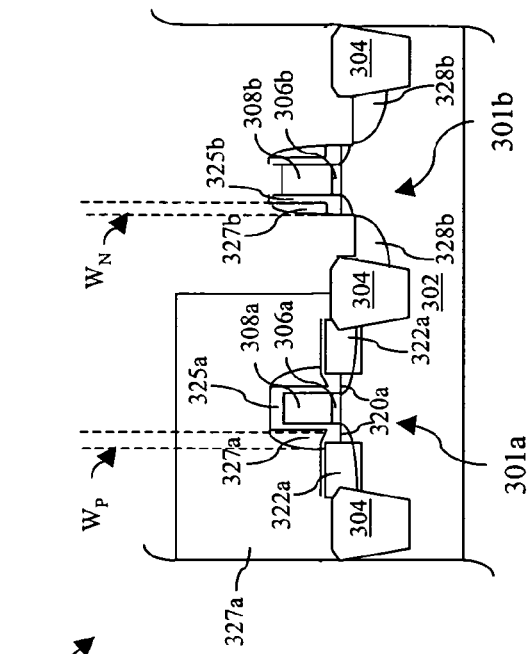
Figure 3I:
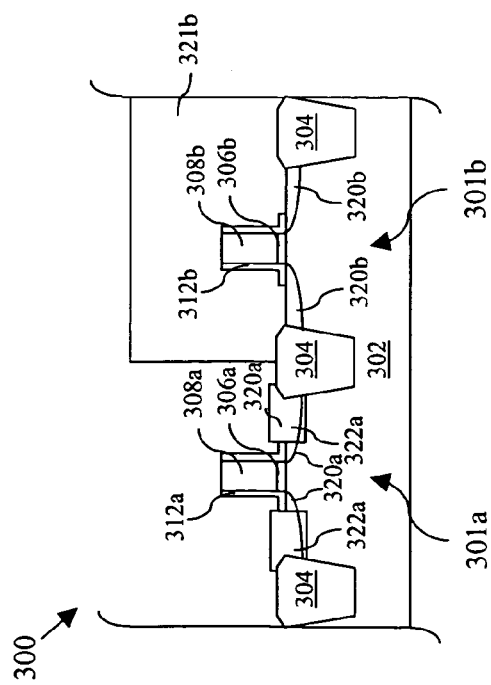
Figure 3J:
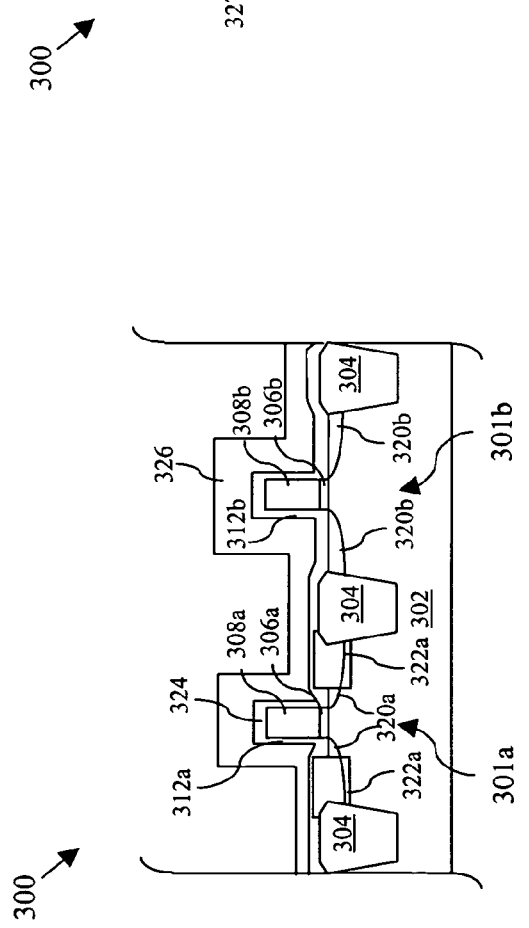

In FIG. 3j, the photoresist 321b over the device 301b is removed, and a liner layer 324 and a protection layer 326 are formed over the semiconductor devices 301a and 301b. The liner layer 324 may be an oxide deposited over the devices, the protection layer 326 may be a nitride deposited over the devices. As further examples, the liner layer 324 and/or the protection layer 326 may include silicon dioxide (SiO$_2$), silicon nitride (Si$_x$N$_y$), silicon oxy-nitride (SiON), silicon carbide (SiC), silicon oxy-carbide (SiOC), photoresist, and/ or other materials. The liner layer 324 and/or the protection layer 326 may be formed by thermal oxidation, ALD, PDL, CVD, PVD, PECVD, spin-on coating, and/or other suitable processes.

In FIG. 3k, the liner layer 324 and the protection layer 326 are patterned, thereby forming hard masks 325a and 325b, and the spacers 327a and 327b. The hard masks 325a and 325b, and the spacers 327a and 327b may be formed by plasma etch, chemical etch, CMP, and/or other processing techniques.

In FIG. 3l, a photoresist 327a is formed over the semiconductor device 301a, so that a portion of the doped regions 320b and the hard mask 325b of the device 301b are removed. It may be seen that the spacers 327b of the device 301b may also be etched during this process, and producing narrower spacers than that of the device 301a. Further, more heavily deeper doped regions 328b are formed on either side of the gate structure of the device 301b. The photoresist 327a is then removed.

In the embodiment shown in FIG. 3l, the spacers 327a of the device 301a may have a width, $W_P$, that may be greater than the width, $W_N$, of the spacers 327b of the device 301b. For example, the width, $W_P$, of the spacers 327a may be 10–50% greater than the spacers 327b. The narrower spacer of the device 301b may advantageously induce higher strain in the device. Alternatively, the width $W_P$ of the spacers 327a may be substantially similar to the width, $W_N$, of the spacers 327b.

In FIG. 3m, another photoresist 329b is disposed over the semiconductor device 301b, and more heavily and deeper doped regions 328a are formed in the semiconductor device 301a. The doped regions 328a may be formed by ion implantation, thermal diffusion, and/or other processing techniques.

In FIG. 3n, the photoresist 329b is removed, and salicided contacts 332a and 332b are formed atop the respective gate electrodes. An etch stop layer 330a and 330b is disposed over the gate electrodes 308a and 308b and doped regions 320a and 328b of the semiconductor devices 301a and 301b, respectively. The salicided contacts 332a and 332b may include the formation of a metal silicide such as cobalt silicide ($CoSi_x$), molybdenum silicide ($MoSi_x$), nickel silicide ($NiSi_x$), titanium silicide ($TiSi_x$), and/or other materials. The formation of the salicided contacts 532a and 532b may also include an anneal. The salicided contacts 332a and 332b may be formed by lithography, chemical etch, plasma etch, CVD, PECVD, ALD, PDL, PVD, and/or other processing techniques. The etch stop layer 330a and 330b may include silicon nitride ($Si_xN_y$), silicon dioxide ($SiO_2$), silicon oxynitride (SiON), and/or other materials. In one embodiment, the etch stop layer 330a and 330b may be substantially similar in composition to the etch stop layer 180 described above. Alternatively, the etch stop layer 330a and 330b may include a stress level that may range between about +0.001 and about +50 GPa for tensile film and between about −0.001 and about −50 GPa for compressive film. The etch stop layer 330a and 330b may be formed by CVD, ALD, PECVD, PDL, spin-on coating, and/or other techniques.

Additional subsequent processing steps may be performed to the semiconductor device(s) 301a and 301b as necessary but are not shown or described herein.

As shown in FIG. 3n, the semiconductor device 301a, a P-type MOS device, comprises raised source and drain regions, and the semiconductor device 301b, an N-type MOS device, comprises recessed source and drain regions. Further the two devices have a single polysilicon thickness but dual spacer thickness, where the device 301b has thinner spacers 327b than the spacers 327a of the device 301a. The processing described above provides the ability to have good control of the critical dimensions of the polysilicon layer of the devices. Further, gate oxide and shallow trench isolation damage or loss is eliminated or minimized.

In one embodiment, the processing method described above may also be adapted for forming the NMOS device 116 and/or the PMOS device 112 of the semiconductor device 100 shown in FIG. 1. Alternatively, the manufacturing steps and/or portions thereof may be adapted for forming other microelectronic devices such as electrically programmable read only memory (EPROM) cell, an electrically erasable programmable read only memory (EEPROM) cell, a static random access memory (SRAM) cell, a dynamic random access memory (DRAM) cell, a single electron transistor (SET), a "fin shaped" field effect transistor (FinFET), a diode, a capacitor, an inductor, and/or other microelectronic devices (hereafter collectively referred to as microelectronic devices). The manufacturing steps may also include a myriad of known processing techniques such as immersion lithography, imprint lithography, maskless lithography, chemical etch, plasma etch, thermal oxidation, atomic layer deposition (ALD), chemical vapor deposition (CVD), physical vapor deposition (PVD), plasma enhanced CVD (PECVD), pulsed deposition layering (PDL), focused ion beam (FIB), chemical mechanical polishing or chemical mechanical planarization (hereafter referred to as CMP), spin-on coating, and/or other processing techniques, and further include techniques to be developed in the future.

Figure 4C:
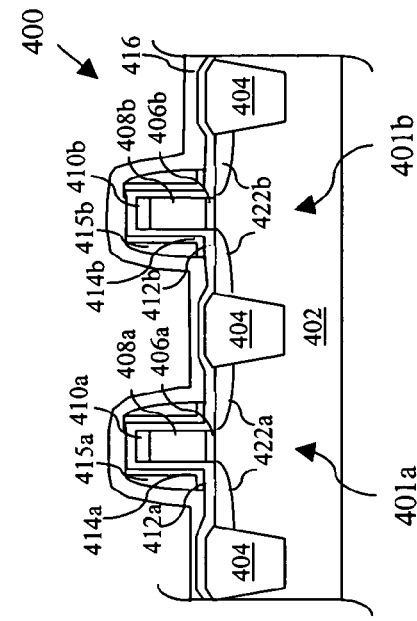
Figure 4D:
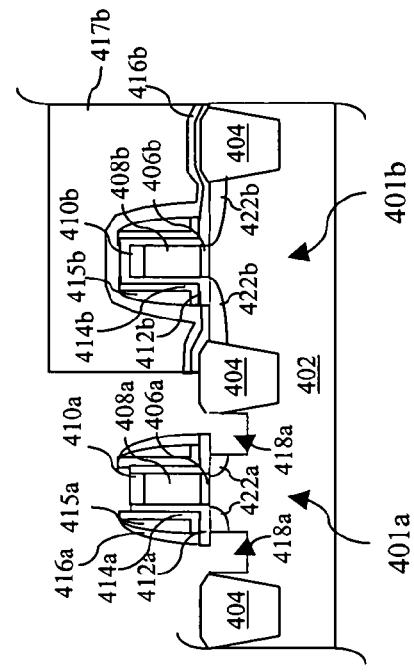
Figure 4A:
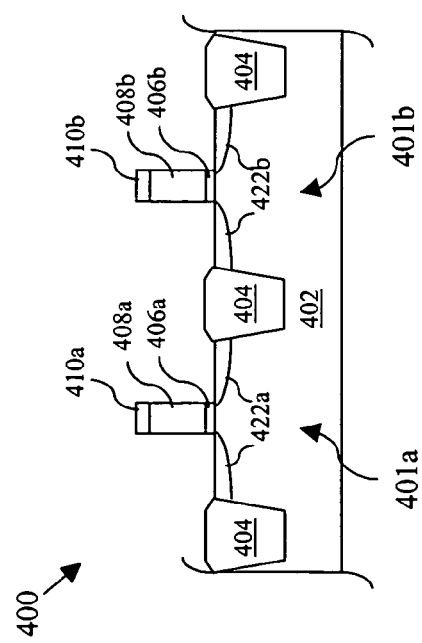

Referring now to FIGS. 4a–4j for sectional views of another embodiment of a method for making semiconductor devices 401a and 401b with high drive current. The semiconductor device 401a may be a P-type MOS device and the semiconductor device 401b may be an N-type MOS device. In FIG. 4a, gate dielectric 406a and 406b are formed over a substrate 402 for devices 401a and 401b, respectively, and electrically isolated from one another by isolation structures 404. The isolation structures 404 may be shallow trench isolation (STI) structures. Gate electrodes 408a and 408b are formed over the gate dielectric layer, and hard masks 410a and 410b are formed over the gate electrodes 408a and 408b, respectively.

The substrate 402 may include silicon, silicon-on-insulation (SOI), germanium, germanium-on-insulation (GOI), gallium arsenide (GaAs), strained silicon, silicon germanium, silicon carbide, diamond, and/or other materials. In one embodiment, the substrate 402 may be substantially similar to the substrate 104 and 205 described above. In another embodiment, the substrate 402 may include an air gap to provide insulation for the microelectronic device 400. For example, a "silicon-on-nothing" (SON) structure may include the semiconductor device(s) 401a and 401b each having a thin insulation layer formed by air and/or other insulators. The gate dielectric 406a and 406b and the gate electrode 408a and 408b may be substantially similar in composition to the gate dielectric layer 120 and 160 and the gate electrode 124 and 164 shown in FIG. 1 and described above.

Alternatively, the gate dielectric 406a and 406b and/or gate electrode 408a and 408b may include multiple layers such as an oxide layer, a high-k dielectric later, a polysilicon layer, strained silicon, silicon germanium, silicon carbide, and/or other material layers. Other materials for the gate dielectric 406a and 406b and the gate electrode 408a and 408b may include titanium (Ti), tantalum (Ta), molybdenum (Mo), cobalt (Co), tungsten (W), titanium nitride (TiN), tantalum nitride (TaN), tungsten nitride ($W_N$), molybdenum silicide (MoSi), tungsten silicide (WSi), cobalt silicide (CoSi), nickel silicide ($NiSi_x$), metal silicides, germanium nanowire, silicon nanowire, and/or other materials. The gate dielectric 406a and 407b may comprise a $SiO_2$ layer and/or nitrided $SiO_2$. Alternatively, the gate dielectric 406a and 406b material may be replaced by the high-k dielectric. In one embodiment, the high-k layer may be formed from a variety of different materials, such as tantalum nitride, titanium nitride, tantoxide ($Ta_2O_5$), hafnium dioxide ($HfO_2$), zirconium dioxide ($ZrO_2$), hafnium silicon oxy-nitride (HfSiON), hafnium silicide ($HfSi_x$), hafnium silicon nitride ($HfSi_xN_y$), hafnium aluminum dioxide ($HfAlO_2$), nickel silicide ($NiSi_x$), and/or other suitable materials using ALD, CVD, PECVD, evaporation, and/or other methods. Generally, the high-k layer may have a thickness between approximately 2 and 500 Angstroms. With some materials, such as HfSiON, the high-k layer of gate electrode 408a and 408b may be blanket deposited on the surface of substrate 402, while other materials may be selectively deposited. Alternatively, it may be desirable to blanket deposit some materials, including HfSiON, in some fabrication processes, while selectively depositing the same materials in other processes.

The hard masks 410a and 410b may include silicon dioxide (SiO$_2$), silicon nitride (Si$_x$N$_y$), silicon oxy-nitride (SiON), titanium nitride (TiN), silicon carbide (SiC), carbide, low-k dielectric, air, and/or other materials. The hard mask 410a and 410b may be formed by lithography, plasma etch, rapid thermal oxidation (RTO), CVD, PECVD, ALD, PVD, and/or other processing techniques now known or to be developed.

The lightly doped regions 422a and 422b may include P-type and N-type dopants for the devices 401a and 401b, respectively. The doped regions 422a and 422b may be formed by ion implantation, thermal diffusion, RTA, and/or other processing techniques. The doped regions 422a and 422b may also include lightly doped regions (LDD) and/or heavily doped regions in one embodiment. The doped regions 422a and 422b may include impurities such as phosphorous, boron, antimony, arsenic, and/or other materials. For example, the formation of the doped regions 422a and 422b by ion implantation may include an ion implant energy ranging between about 1 KeV and about 100 KeV and the dose of ion implantation of may range between about $1 \times 10^{13}$ cm$^{-2}$ and about $5 \times 10^{16}$ cm$^{-2}$.

Figure 4B:
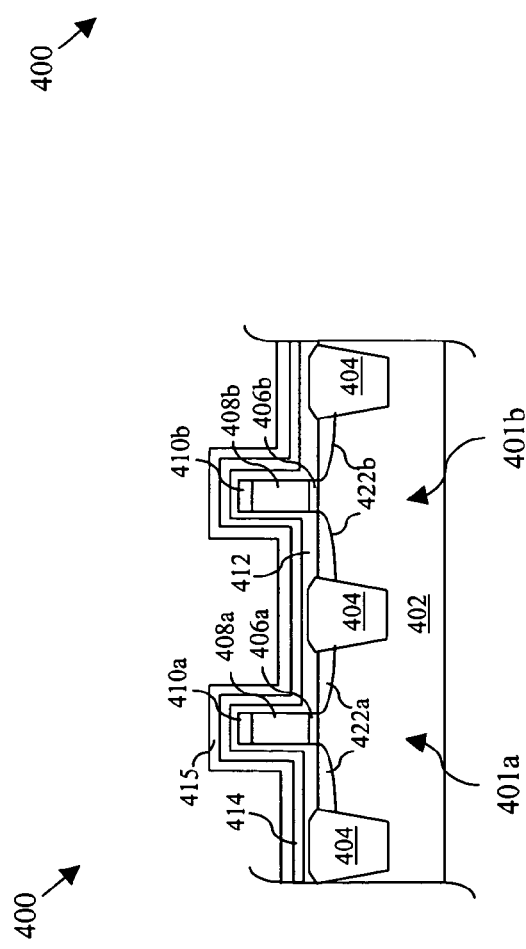

In FIG. 4b, sidewall dielectric layers 412 and 414, and spacer material 415 are disposed over the semiconductor device(s) 410a and 401b and are subsequently processed, such as by etching, to form sidewall dielectric structures 412a, 412b, 414a and 414b, and spacers 415a and 415b, as shown in FIG. 4c. Note the dielectric structures 714a and 714b are substantially L-shaped. A dummy spacer layer 416 is formed over the semiconductor devices 401a and 401b. Low temperature processing, such as using a temperature less than 600° C., to form the sidewall dielectric and spacer materials is preferred to reduce lightly doped drain diffusion.

The sidewall dielectric layers 412 and 414 may be a liner oxide layer and a nitride layer formed over the devices by deposition. In particular, the sidewall dielectric layers 412 and 414 may include thermal oxide (SiO$_2$), TEOS oxide, silicon nitride (Si$_x$N$_y$), silicon dioxide (SiO$_2$), silicon oxy-nitride (SiON), polymer and/or other materials. The sidewall dielectric layers 412 and 414 may also include multiple layers and/or may include a single layer, in one embodiment. The sidewall dielectric layers 412 and 414 may be formed by RTO, CVD, PVD, PECVD, ALD, CMP, chemical etching, plasma etching, and/or other processing techniques. The spacer material 415 may include thermal oxide (SiO$_2$), TEOS oxide, silicon nitride (Si$_x$N$_y$), silicon dioxide (SiO$_2$), polymer and/or other materials. The spacer material 415 may also include multiple layers and/or may include a single layer, in one embodiment. The spacer material 415 may be formed by RTO, CVD, PVD, PECVD, ALD, CMP, chemical etching, plasma etching, and/or other processing techniques. The sidewall dielectric structures 412a, 412b, 414a and 414b, and spacers 415a and 415b may be formed by chemical etching, plasma etching, CMP, focused ion beam (FIB), and/or other processing techniques.

In FIG. 4d, the dummy spacer material 416 is processed to form the dummy spacers 416a and 416b. The dummy spacer material 416 may include silicon dioxide (SiO$_2$), silicon nitride (Si$_x$N$_y$), silicon oxy-nitride (SiON), silicon oxy-carbide (SiOC), polymer, and/or other materials. The spacer material 416 may be formed by CVD, PECVD, ALD, spin-on coating, and/or other processing techniques, for example, and the dummy spacers 416a and 416b may be formed by chemical etch, plasma etch, CMP, focused ion beam (FIB), and/or other processing techniques. In FIG. 4d, a photoresist 417b is provided over the device 401b so that portions of the dummy spacer material 416a is removed from the device 401a, and recessed source and drain regions 418a are also formed in the substrate 402 on either side of the gate structure of the device 401a.

The recessed source and drain regions 418a may be formed by a process such as chemical etch, focused ion beam (FIB), and/or plasma etch. In particular, the recessed regions 418a may be formed by a chemical etch of the exposed substrate interposed by the isolation regions 404 and the dummy spacers 416a. In one embodiment, a portion of the substrate 402 below the dummy spacers 416a may be removed, as shown in FIG. 4d.

Figure 4E:
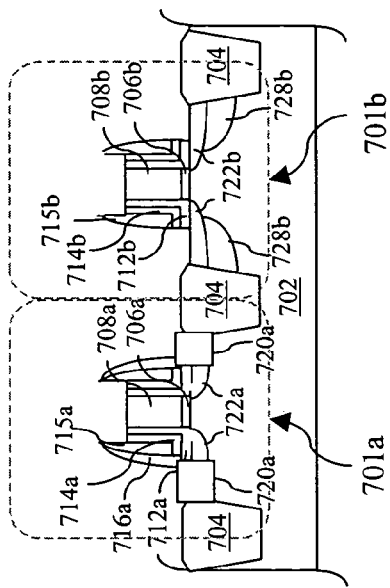

In FIG. 4e, the photoresist 417b is removed, and doped source and drain regions 420a are formed or built-up in the recessed regions 418a. The doped source and drain regions 420a may be formed by selective epitaxial growth (SEG), CVD, PECVD, PVD, PDL, ALD, spin-on formation, and/or other techniques now know or to be developed. The doped source and drain regions 420a may include materials such as amorphous silicon, polysilicon, strained silicon, germanium, silicon germanium, silicon carbide, and/or other materials. Low temperature processing, such as using a temperature less than 700° C., to form the doped regions 420a is preferred to reduce lightly doped drain diffusion.

Figure 4H:
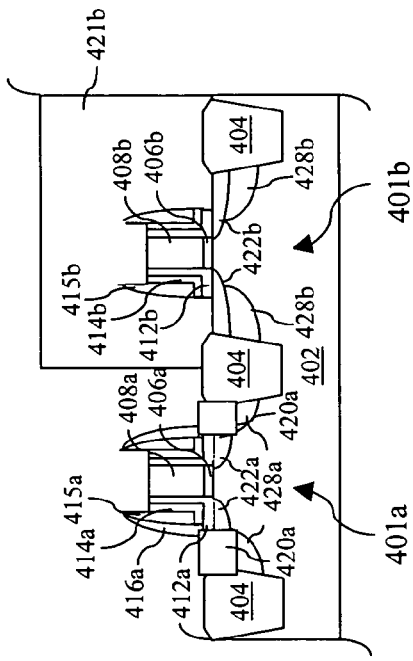
Figure 4G:
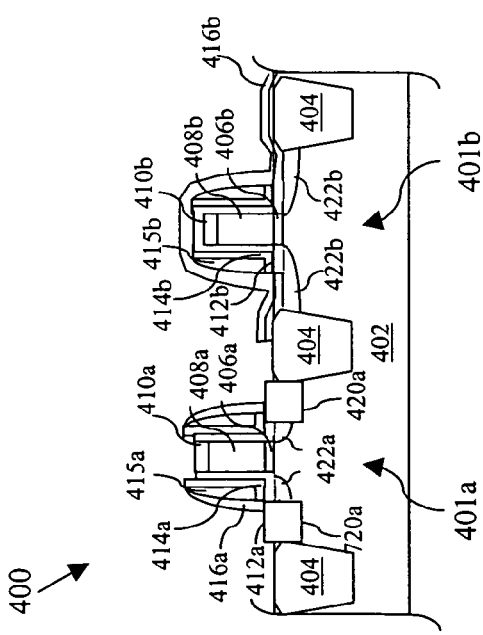
Figure 4F:

In FIG. 4f, a photoresist 421a is disposed over the semiconductor device 401a. Further, the dummy spacer 716b is removed from the device 401b. The spacer material 416b may be removed by chemical etch, plasma etch, CMP focused ion beam (FIB), and/or other processing techniques. Deeper and more heavily doped regions 428b are also formed in the substrate 402 in the semiconductor device 401b. The doped regions 428b may include N-type impurities, and may be formed by ion implantation, thermal diffusion, RTA, and/or other processing techniques. The doped regions 428b may include heavy doped regions forming the source/drain regions of the semiconductor device 701b. The ion implantation may include an ion implant energy ranging between about 5 KeV and about 100 KeV and the dose of ion implantation of may range between about $1 \times 10^{14}$ cm$^{-2}$ and about $5 \times 10^{18}$ cm$^{-2}$.

In FIG. 4g, the photoresist 421a is removed from the device 401a. Further, the hard masks 410a and 410b are removed from the semiconductor devices 401a and 401b. The photoresist 421a may be removed by plasma etch and/or chemical etch. For example, the mask 421a may be removed by an oxygen (O$_2$) containing plasma environment. The hard masks 410a and 410b may be removed by chemical and/or plasma etch. For example, the hard masks 410a and 410b may be removed by hot phosphoric (H$_2$PO$_4$) acid, ammonium hydroxide (NH$_{40}$H), hydrochloric acid (HCl), hydrofluoric acid (HF), sulfuric acid (H$_2$SO$_4$), and/or other etchant chemicals. The hard masks 420a and 420b may also be removed by ion bombardment in an inert plasma comprising argon, hydrogen, xenon, and/or other gases.

In FIG. 4h, a photoresist 421b is formed over the semiconductor device 401a. The mask 421b may include photoresist, silicon dioxide (SiO$_2$), silicon nitride (Si$_x$N$_y$), and/or other materials. The mask 421b may be formed by spin-on coating, CVD, and/or other processing techniques. Further, more heavily doped source and drain regions 428a are formed in the substrate 402 for the semiconductor device 401a. The doped regions 428a which may include P-type impurities, and may be formed by ion implantation, thermal diffusion, RTA, and/or other processing techniques. The ion implantation may include an ion implant energy ranging between about 5 KeV and about 100 KeV and the dose of ion implantation of may range between about $1 \times 10^{14}$ cm$^{-2}$ and about $5 \times 10^{18}$ cm$^{-2}$ for example.

In FIG. 4*i*, the photoresist 421*b* is removed from the device 401*b*, and salicided contacts 432*a* and 432*b* are formed over the gate, source and drain of the devices 401*a* and 401*b*. The salicided contacts 432*a* and 432*b* may include the formation of a metal silicide such as cobalt silicide (CoSi$_x$), molybdenum silicide (MoSi$_x$), nickel silicide (NiSi$_x$), titanium silicide (TiSi$_x$), and/or other materials. The formation of the salicided contacts 732*a* and 732*b* may also include an anneal. The salicided contacts 732*a* and 732*b* may be formed by lithography, chemical etch, plasma etch, CVD, PECVD, ALD, PDL, PVD, and/or other processing techniques.

Further in FIG. 4*j*, an etch stop layer 430*a* and 430*b* are formed over the semiconductor device(s) 401*a* and 401*b*. The etch stop layer 430*a* and 430*b* may include silicon nitride (Si$_x$N$_y$), silicon dioxide (SiO$_2$), silicon oxy-nitride (SiON), and/or other materials. In one embodiment, the etch stop layer 430*a* and 430*b* may be substantially similar in composition to the etch stop layer 180 described above. Alternatively, the etch stop layer 430*a* and 430*b* may include a stress level that may range between about +0.001 and about +50 GPa for tensile film and between about −0.001 and about −50 GPa for compressive film. The etch stop layer 430*a* and 430*b* may be formed by CVD, ALD, PECVD, PDL, spin-on coating, and/or other techniques.

Subsequent processing steps may be performed to the semiconductor devices 401*a* and 401*b* such as metallization, testing and packaging, etc.

Figure 5I:
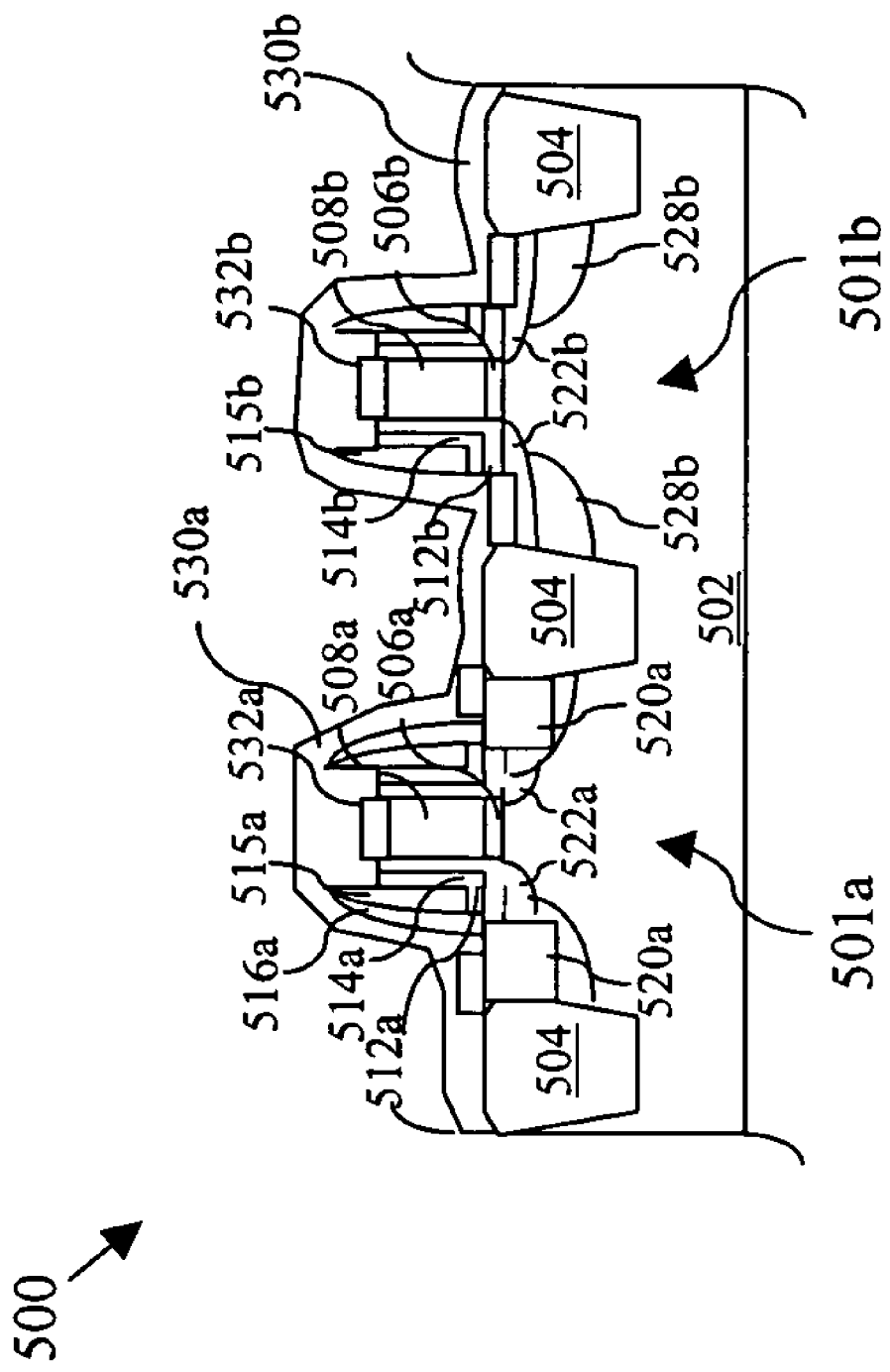

Referring now to FIGS. 5*a*–*i* for another embodiment of a method for manufacturing a microelectronic device 500 with high drive current. In FIG. 5*a*, gate structures including a gate dielectric 506*a* and 506*b* and gate electrodes 508*a* and 508*b* are formed for semiconductor devices 501*a* and 501*b*, respectively. Gate electrodes 508*a* and 508*b* may be pre-doped with appropriate P-type and N-type dopants, respectively. Hard masks 510*a* and 510*b* are also formed over each gate structure. Further, shallow doped drain and source regions 522*a* and 522*b* are formed on either sides of the gate structures of each device 501*a* and 501*b*. Isolation structures 504 are formed in the substrate 502 to electrically isolate the devices 501*a* and 501*b*.

The substrate 502 may include silicon, silicon-on-insulation (SOI), germanium, germanium-on-insulation (GOI), gallium arsenide (GaAs), strained silicon, diamond, and/or other materials. In another embodiment, the substrate 502 may include an air gap to provide insulation for the microelectronic device 500. For example, a "silicon-on-nothing" (SON) structure may include the semiconductor devices 501*a* and 501*b* each having a thin insulation layer formed by air and/or other insulator. The gate dielectric 506*a* and 506*b* and the gate electrode 508*a* and 508*b*, in one embodiment, may be substantially similar in composition to the gate dielectric layer 120 and 160 and the gate electrode 124 and 164 shown in FIG. 1. Alternatively, the gate dielectric 506*a* and 506*b* and/or gate electrode 508*a* and 508*b* may include multiple layers such as an oxide layer, a high-k dielectric later, a polysilicon layer, strained silicon, silicon germanium, silicon carbide, and/or other material layers. Other materials for the gate dielectric 506*a* and 506*b* and the gate electrode 508*a* and 508*b* may include titanium (Ti), tantalum (Ta), molybdenum (Mo), cobalt (Co), tungsten (W), titanium nitride (TiN), tantalum nitride (TaN), tungsten nitride (W$_N$), molybdenum silicide (MoSi), tungsten silicide (WSi), cobalt silicide (CoSi), nickel silicide (NiSi$_x$), metal silicides, germanium nanowire, silicon nanowire, and/or other materials. The gate dielectric 506*a* and 506*b* may comprise a SiO$_2$ layer and/or nitrided SiO$_2$. In one embodiment, the high-k layer may be formed from a variety of different materials, such as tantalum nitride, titanium nitride, tantoxide (Ta$_2$O$_5$), hafnium dioxide (HfO$_2$), zirconium dioxide (ZrO$_2$), hafnium silicon oxy-nitride (HfSiON), hafnium silicide (HfSi$_x$), hafnium silicon nitride (HfSi$_x$N$_y$), hafnium aluminum dioxide (HfAlO$_2$), nickel silicide (NiSi$_x$), and/or other suitable materials using ALD, CVD, PECVD, evaporation, and/or other methods. With some materials, such as HfSiON, the high-k layer of gate electrode 508*a* and 508*b* may be blanket deposited on the surface of substrate 502, while other materials may be selectively deposited. Alternatively, it may be desirable to blanket deposit some materials, including HfSiON, in some fabrication processes, while selectively depositing the same materials in other processes.

The hard masks 510*a* and 510*b* may include silicon dioxide (SiO$_2$), silicon nitride (Si$_x$N$_y$), silicon oxy-nitride (SiON), titanium nitride (TiN), silicon carbide (SiC), carbide, low-k dielectric, air, and/or other materials. The hard mask 510*a* and 510*b* may be formed by lithography, plasma etch, rapid thermal oxidation (RTO), CVD, PECVD, ALD, PVD, and/or processing techniques.

The doped source and drain regions 522*a* and 522*b* may include N-type and/or P-type doped regions formed by ion implantation, thermal diffusion, RTA, and/or other processing techniques. The doped regions 522*a* and 522*b* may be lightly doped drains (LDD) and may include impurities such as phosphorous, boron, antimony, arsenic, and/or other materials.

In FIG. 5*b*, sidewall dielectric layers 512 and 514, and a spacer material 515 are formed over the semiconductor devices 510*a* and 501*b*, preferably using a low temperature process to reduce LDD diffusion. The sidewall dielectric layers 512 and 514 may include thermal oxide (SiO$_2$), TEOS oxide, silicon nitride (Si$_x$N$_y$), silicon dioxide (SiO$_2$), silicon oxy-nitride (SiON), polymer and/or other materials. The spacer material 515 may include thermal oxide (SiO$_2$), TEOS oxide, silicon nitride (Si$_x$N$_y$), silicon dioxide (SiO$_2$), polymer and/or other materials. For example, dielectric layers 512 and 514 may comprise a liner oxide layer and a nitride layer, and the spacer material 515 may comprise an oxide material. The sidewall dielectric layers 512 and 514 and spacer layer 515 may be formed by RTO, CVD, PVD, PECVD, ALD, CMP, chemical etching, plasma etching, and/or other processing techniques.

In FIG. 5*c*, the sidewall dielectric layers 512 and 514, and a spacer material 515 are subsequently processed forming sidewall dielectric 512*a*, 512*b*, 514*a* and 514*b*, and spacers 515*a* and 515*b*. The sidewall dielectric 512*a*, 512*b*, 514*a* and 514*b*, and spacers 515*a* and 515*b* may be formed by chemical etching, plasma etching, CMP, focused ion beam (FIB), and/or other processing techniques.

Further, a dummy spacer material 516 is formed over the semiconductor devices 501*a* and 501*b*, and subsequently processed forming the dummy spacers 516*a* and 516*b*. The dummy spacer material 516 may include silicon dioxide (SiO$_2$), silicon nitride (Si$_x$N$_y$), silicon oxy-nitride (SiON), silicon oxy-carbide (SiOC), polymer, and/or other materials. The spacer material 516 may be formed by CVD, PECVD, ALD, spin-on coating, and/or other processing techniques, and may be formed by chemical etch, plasma etch, CMP, focused ion beam (FIB), and/or other processing techniques.

In FIG. 5*d*, a photoresist 517*b* is formed over the semiconductor device 501*b* so that the device 501*a* may be processed. An oxide etch process may be used to remove material layers above the hard mask 510*a* disposed over the gate structure. Another etch process may also be used to create recessed source and drain regions 518*a* in the substrate 502. The recessed source and drain regions 518a may be formed by a process such as chemical etch, focused ion beam (FIB), and/or plasma etch. In the embodiment shown in FIG. 5d, a portion of the substrate 502 extending partially below the spacer 516a is also removed.

In FIG. 5e, the photoresist 517b is removed from the device 501b and source and drain regions 520a are built-up in the recessed regions 518a, preferably using a low temperature process to reduce LDD diffusion. The source and drain regions 520a may be formed by, for example, selective epitaxial growth (SEG), CVD, PECVD, PVD, PDL, ALD, spin-on formation, and/or other suitable techniques now know or later developed. The source and drain regions 520a may include materials such as amorphous silicon, polysilicon, strained silicon, germanium, silicon germanium, silicon carbide, and/or other materials. The source and drain regions 520a may also be doped "in-situ" during the SEG process, for example. In this process, dopants such as boron, phosphorous, arsenic, germanium, carbon, and/or other semiconductor materials may be introduced during the SEG process. The dopants may be introduced in gaseous form, which may include diborane ($B_2H_6$), Arsine ($AsH_3$), phosphine ($PH_3$), germane ($GeH_4$), phosphoryl chloride ($POCL_3$), boron bromide ($BBr_3$), hydrocarbons, and/or other gases/chemicals.

In FIG. 5f, a photoresist 521a is disposed over the semiconductor device 501a for processing of the semiconductor device 501b. The dummy spacer material 516b is removed from the device 501b, and deeper source and drain doped regions 528b are formed. The spacer material 516b may be removed by chemical etch, plasma etch, CMP focused ion beam (FIB), and/or other processing techniques, for example. The doped regions 528b may include N-type impurities, and may be formed by ion implantation, thermal diffusion, RTA, and/or other processing techniques. The ion implantation process may use an ion implant energy ranging between about 5 KeV and about 100 KeV and the dose of ion implantation of may range between about $1 \times 10^{14}$ $cm^{-2}$ and about $5 \times 10^{18}$ $cm^{-2}$, for example.

In FIG. 5g, the photoresist 521a is removed from the device 501a. Further, the hard masks 510a and 510b are removed from the gate structures of the semiconductor devices 501a and 501b. The hard masks 510a and 510b may be removed from the semiconductor devices by chemical and/or plasma etch. For example, the hard masks 510a and 510b may be removed by hot phosphoric ($H_3PO_4$) acid, ammonium hydroxide ($NH_4OH$), hydrochloric acid (HCl), hydrofluoric acid (HF), sulfuric acid ($H_2SO_4$), and/or other chemicals. The hard mask 510a and 510b may also be removed by ion bombardment in an inert plasma comprising argon, hydrogen, xenon, and/or other gases.

Because the deeper doped source and drain regions were doped in-situ (FIG. 5g), a process of source and drain implantation such as that shown in FIG. 4h is not required. Therefore, salicided contacts 532a and 532b are formed for the gate, source and drains of the devices 501a and 501b, respectively, as shown in FIG. 5h. The salicided contacts 532a and 532b may include the formation of a metal silicide such as cobalt silicide ($CoSi_x$), molybdenum silicide ($MoSi_x$), nickel silicide ($NiSi_x$), titanium silicide ($TiSi_x$), and/or other materials. The formation of the salicided contacts 532a and 532b may also include an anneal. The salicided contacts 532a and 532b may be formed by lithography, chemical etch, plasma etch, CVD, PECVD, ALD, PDL, PVD, and/or other processing techniques.

In FIG. 5i, etch stop layer 530a and 530b are formed over the semiconductor devices 501a and 501b. The etch stop layer 530a and 530b may include silicon nitride ($Si_xN_y$), silicon dioxide ($SiO_2$), silicon oxy-nitride (SiON), and/or other materials. Alternatively, the etch stop layer 530a and 530b may include a stress level that may range between about +0.001 and about +50 GPa for tensile film and between about −0.001 and about −50 GPa for compressive film. The etch stop layer 530a–b may be formed by CVD, ALD, PECVD, PDL, spin-on coating, and/or other techniques.

Figure 6A:
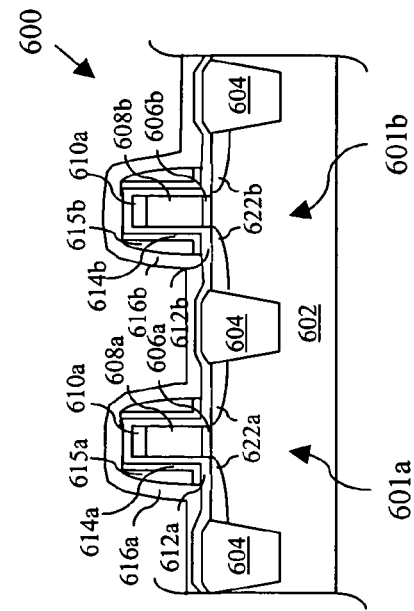

Referring now to FIGS. 6a–i, sectional views of yet another embodiment of a method for manufacturing a microelectronic device 600 having high drive current is shown. The semiconductor device 601a may be a P-type MOS device and the semiconductor device 601b may be an N-type MOS device. In FIG. 6a, gate dielectric 606a and 606b are formed over a substrate 602 for devices 601a and 601b, respectively, and electrically isolated from one another by isolation structures 604. The isolation structures 604 may be shallow trench isolation (STI) structures. Gate electrodes 608a and 608b are formed over the gate dielectric layer, and hard masks 610a and 610b are formed over the gate electrodes 608a and 608b, respectively.

As described above, the substrate 602 may include silicon, silicon-on-insulation (SOI), germanium, germanium-on-insulation (GOI), gallium arsenide (GaAs), strained silicon, silicon germanium, silicon carbide, diamond, and/or other materials. In one embodiment, the substrate 602 may be substantially similar to the substrate 104 and 205 described above. In another embodiment, the substrate 602 may include an air gap. For example, a "silicon-on-nothing" (SON) structure may include the semiconductor device(s) 601a and 601b each having a thin insulation layer formed by air and/or other insulators. The gate dielectric 606a and 606b and the gate electrode 608a and 608b may be substantially similar in composition to the gate dielectric layer 120 and 160 and the gate electrode 124 and 164 shown in FIG. 1 and described above.

Alternatively, the gate dielectric 606a and 606b and/or gate electrode 608a and 608b may include multiple layers such as an oxide layer, a high-k dielectric later, a polysilicon layer, strained silicon, silicon germanium, silicon carbide, and/or other material layers. Other materials for the gate dielectric 606a and 606b and the gate electrode 608a and 608b may include titanium (Ti), tantalum (Ta), molybdenum (Mo), cobalt (Co), tungsten (W), titanium nitride (TiN), tantalum nitride (TaN), tungsten nitride (WN), molybdenum silicide (MoSi), tungsten silicide (WSi), cobalt silicide (CoSi), nickel silicide ($NiSi_x$), metal silicides, germanium nanowire, silicon nanowire, and/or other materials. The gate dielectric 606a and 607b may comprise a $SiO_2$ layer and/or nitrided $SiO_2$. Alternatively, the gate dielectric 606a and 606b material may be replaced by the high-k dielectric. In one embodiment, the high-k layer may be formed from a variety of different materials, such as tantalum nitride, titanium nitride, tantoxide ($Ta_2O_5$), hafnium dioxide ($HfO_2$), zirconium dioxide ($ZrO_2$), hafnium silicon oxy-nitride (HfSiON), hafnium silicide ($HfSi_x$), hafnium silicon nitride ($HfSi_xN_y$), hafnium aluminum dioxide ($HfAlO_2$), nickel silicide ($NiSi_x$), and/or other suitable materials using ALD, CVD, PECVD, evaporation, and/or other methods. For example, the high-k layer may have a thickness between approximately 2 and 500 Angstroms. With some materials, such as HfSiON, the high-k layer of gate electrode 608a and 608b may be blanket deposited on the surface of substrate 602, while other materials may be selectively deposited. Alternatively, it may be desirable to blanket deposit some materials, including HfSiON, in some fabrication processes, while selectively depositing the same materials in other processes.

The hard masks 610a and 610b may include silicon dioxide (SiO$_2$), silicon nitride (Si$_x$N$_y$), silicon oxy-nitride (SiON), titanium nitride (TiN), silicon carbide (SiC), carbide, low-k dielectric, air, and/or other materials. The hard mask 610a and 610b may be formed by lithography, plasma etch, rapid thermal oxidation (RTO), CVD, PECVD, ALD, PVD, and/or other processing techniques now known or to be developed.

The lightly doped regions 622a and 622b may include P-type and N-type dopants for the devices 601a and 601b, respectively. The doped regions 622a and 622b may be formed by ion implantation, thermal diffusion, RTA, and/or other processing techniques. The doped regions 622a and 622b may also include lightly doped regions (LDD) and/or heavily doped regions in one embodiment. The doped regions 622a and 622b may include impurities such as phosphorous, boron, antimony, arsenic, and/or other materials. For example, the formation of the doped regions 622a and 622b by ion implantation may include an ion implant energy ranging between about 1 KeV and about 100 KeV and the dose of ion implantation of may range between about $1 \times 10^{13}$ cm$^{-2}$ and about $5 \times 10^{16}$ cm$^{-2}$, for example.

Figure 6B:
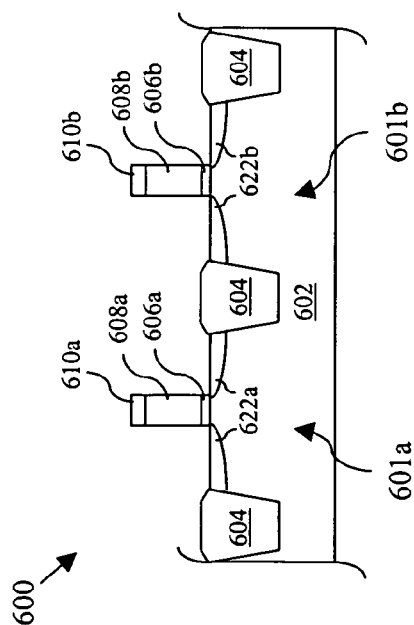

In FIG. 6b, sidewall dielectric layers 612 and 614, and a spacer material 615 are formed over the semiconductor devices 610a and 601b, preferably using a low temperature process to reduce LDD diffusion. The sidewall dielectric layers 612 and 614 may include thermal oxide (SiO$_2$), TEOS oxide, silicon nitride (Si$_x$N$_y$), silicon dioxide (SiO$_2$), silicon oxy-nitride (SiON), polymer and/or other materials. The spacer material 615 may include thermal oxide (SiO$_2$), TEOS oxide, silicon nitride (Si$_x$N$_y$), silicon dioxide (SiO$_2$), polymer and/or other materials. For example, dielectric layers 612 and 614 may comprise a liner oxide layer and a nitride layer, and the spacer material 615 may comprise an oxide material. The sidewall dielectric layers 612 and 614 and spacer layer 615 may be formed by RTO, CVD, PVD, PECVD, ALD, CMP, chemical etching, plasma etching, and/or other processing techniques.

Figure 6C:
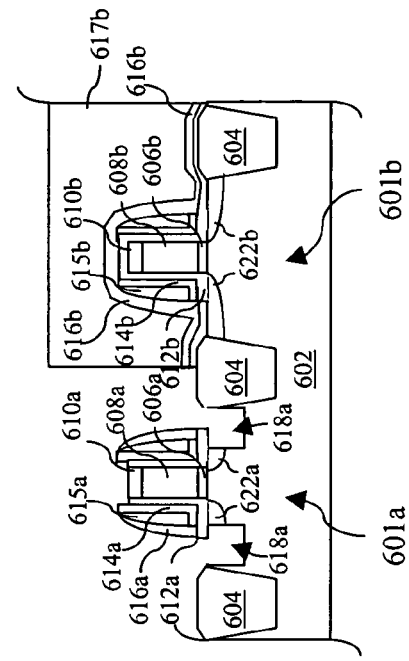

In FIG. 6c, the sidewall dielectric layers 612 and 614, and a spacer material 615 are subsequently processed forming sidewall dielectric 612a, 612b, 614a and 614b, and spacers 615a and 615b. The sidewall dielectric 612a, 612b, 614a and 614b, and spacers 615a and 615b may be formed by chemical etching, plasma etching, CMP, focused ion beam (FIB), and/or other processing techniques.

Further, a dummy spacer material 616 is formed over the semiconductor devices 601a and 601b, and subsequently processed forming the dummy spacers 616a and 616b. The dummy spacer material 616 may include silicon dioxide (SiO$_2$), silicon nitride (Si$_x$N$_y$), silicon oxy-nitride (SiON), silicon oxy-carbide (SiOC), polymer, and/or other materials. The spacer material 616 may be formed by CVD, PECVD, ALD, spin-on coating, and/or other processing techniques, and may be formed by chemical etch, plasma etch, CMP, focused ion beam (FIB), and/or other processing techniques.

Figure 6D:
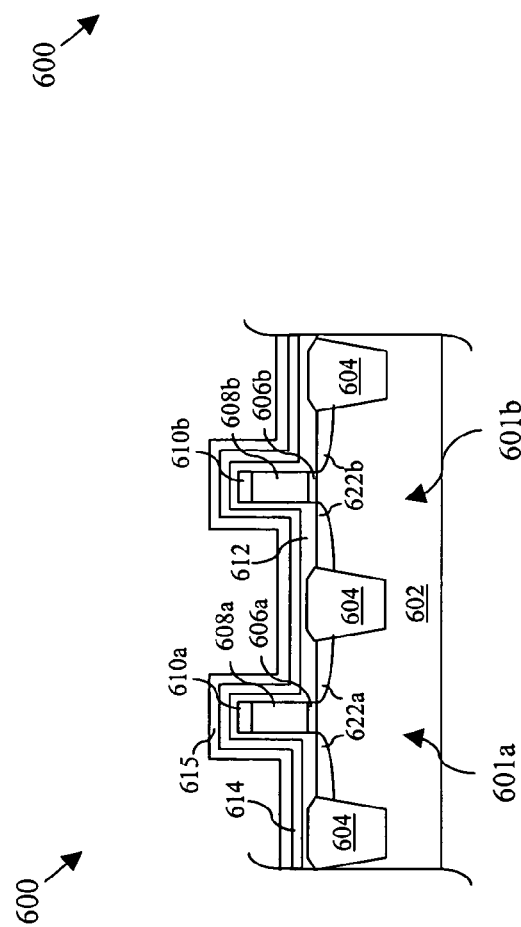

In FIG. 6d, a photoresist 617b is formed over the semiconductor device 601b so that the device 601a may be processed. An oxide etch process may be used to remove material layers above the hard mask 610a disposed over the gate structure. Another etch process may also be used to create recessed source and drain regions 618a in the substrate 602. The recessed source and drain regions 618a may be formed by a process such as chemical etch, focused ion beam (FIB), and/or plasma etch. In the embodiment shown in FIG. 6d, a portion of the substrate 602 extending partially below the spacer 616a is also removed.

In FIG. 6e, the photoresist 617b is removed from the device 601b and source and drain regions 620a are built-up in the recessed regions 618a, preferably using a low temperature process to reduce LDD diffusion. The source and drain regions 620a may be formed by, for example, selective epitaxial growth (SEG), CVD, PECVD, PVD, PDL, ALD, spin-on formation, and/or other suitable techniques now know or later developed. The source and drain regions 620a may include materials such as amorphous silicon, polysilicon, strained silicon, germanium, silicon germanium, silicon carbide, and/or other materials.

In 6f, a photoresist 621a is formed over the device 601a. In device 601b, the spacer material 616b is removed and the hard mask 610b is also removed. These material layers may be removed using suitable etching processes as described above. The hard mask removal step is not performed in the same sequence in the method described above and shown in FIGS. 4f and 5f. Further, deeper and/or more heavily doped source and drain regions for the device 601b are also formed using suitable processes as described above.

In step 6g, the photoresist 621a over the device 601a is removed, and a photoresist 621b is formed over the device 601b. The hard mask 610a over the gate electrode of device 601a is removed. Deeper and/or more heavily doped source and drain regions 628a are formed in the substrate 602 on either side of the gate structure of the device 601a. The formation of the source and drain regions 628a was not performed in the same sequence in the methods describe above and shown in FIGS. 4g and 5g.

In FIG. 6h, the photoresist 621b over the device 601b is removed. Further, spacers 615a, 615b, 616a, and 616b are removed from both devices. In addition, salicided contacts 632a and 632b are formed over the gate, source and drain structures of the devices 601a and 601b. The spacers may be removed by chemical etch, plasma etch, CMP, and/or other processing techniques. In one embodiment, the spacers may be removed by etchants such as hot phosphoric (H$_2$PO$_4$) acid, ammonium hydroxide (NH$_4$OH), hydrochloric acid (HCl), hydrofluoric acid (HF), sulfuric acid (H$_2$SO$_4$), and/or other chemicals.

Figure 6I:
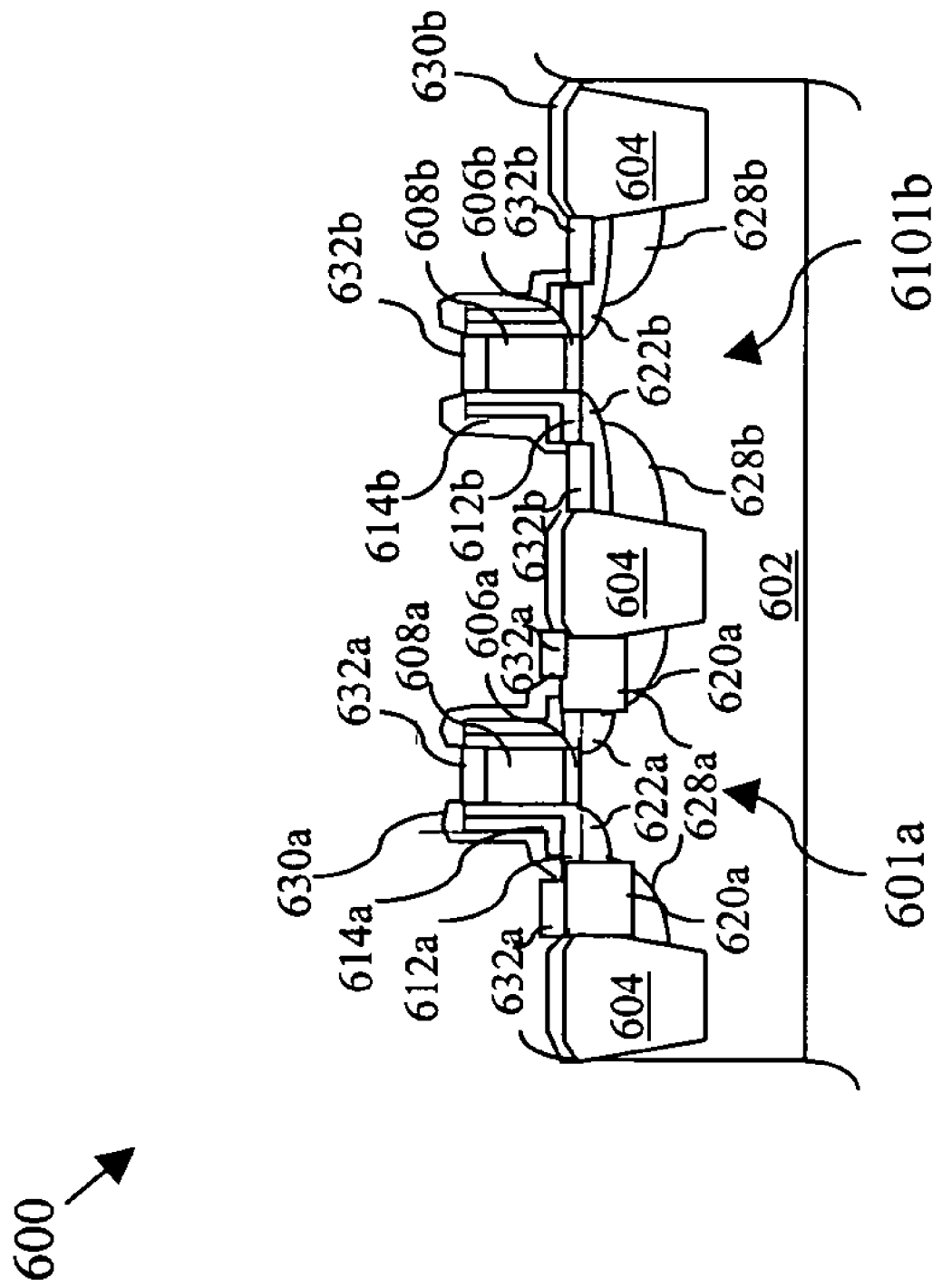

In FIG. 6i, an etch stop layer 630a and 630b are formed over the semiconductor devices 601a and 601b. The etch stop layer 630a and 630b may include silicon nitride (Si$_x$N$_y$), silicon dioxide (SiO$_2$), silicon oxy-nitride (SiON), and/or other materials. The etch stop layer 630a and 630b may include a stress level that may range between about +0.001 and about +50 GPa for tensile film and between about −0.001 and about −50 GPa for compressive film. The etch stop layer 630a and 630b may be formed by CVD, ALD, PECVD, PDL, spin-on coating, and/or other techniques, for example.

Figure 7:
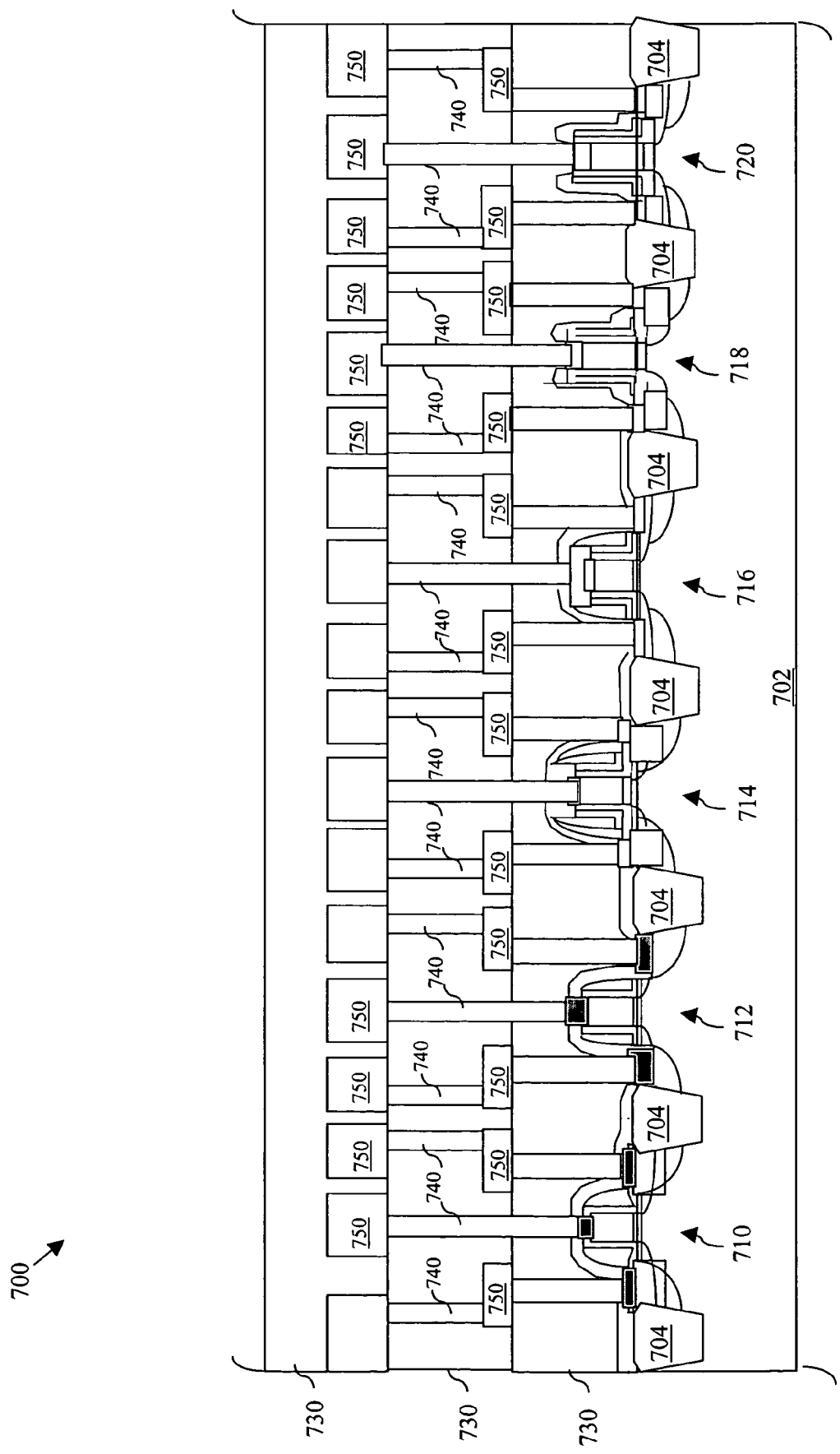
FIG. 7 is a sectional view of one embodiment of an integrated circuit device constructed according to aspects of the present disclosure.

Referring to FIG. 7, illustrated is one embodiment of an integrated circuit device 700 constructed according to aspects of the present disclosure. The integrated circuit device 700 is one environment in which embodiments of the microelectronic device 300, 400, 500, and 600 shown in FIGS. 3a–n, 4a–j, 5a–i, 6a–i may be implemented. The microelectronic devices may form a logic circuit and/or other transistor array, including a one-, two- or three-dimensional array, and may be oriented in one or more rows and/or one or more columns, such as on or over a substrate.

The integrated circuit device 700 also includes interconnects 740 and 750 extending along and/or through one or more dielectric layers 730 to ones of the plurality of semiconductor devices 710, 712, 714, 716, 718, and/or 720. The dielectric layer 730 may include silicon dioxide, fluoride-doped silicate glass (FSG), Black Diamond® (a product of Applied Materials of Santa Clara, Calif.), Xerogel, Aerogel, amorphous fluorinated carbon, Parylene, BCB (bis-benzo-cyclobutenes), and SiLK™ (a product of Dow Chemical of Midland, Mich.), and/or other materials, and may be formed by CVD, PECVD, PDL, ALD, PVD, focused ion beam (FIB), Langmuir-Blodgett (LB) molecular assembly, spin-on coating and/or other processes. The interconnects 740 and 750 may include copper (Cu), tungsten (W), gold (Au), aluminum, carbon nano-tubes, carbon fullerenes, refractory metals, alloys of these materials and/or other materials, and may be formed by CVD, PECVD, ALD, PVD and/or other processes. The interconnects 740, 750 may also include more than one layer. For example, each interconnect 740, 750 may include an adhesion layer possibly comprising titanium (Ti), titanium nitride (TiN), tantalum (Ta) or tantalum nitride (TaN), silicon carbide (SiC), silicon oxy-carbide (SiOC), a barrier layer possibly comprising titanium nitride (TiN) and/or tantalum nitride (TaN), silicon carbide (SiC), silicon oxy-carbide (SiOC), and a bulk conductive layer comprising copper (Cu), tungsten (W), aluminum (Al), or aluminum alloy.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor circuit, comprising:
   a first semiconductor device in a substrate, the first semiconductor device comprises:
   a gate structure;
   a spacer disposed on sidewalls of the gate structure, the spacer having a first thickness;
   raised source and drain regions disposed on either side of the gate structure;
   a second semiconductor device in the substrate and electrically isolated from the first semiconductor device, the second semiconductor device comprises:
   a gate structure;
   a spacer disposed on sidewalls of the gate structure, the spacer having a second thickness less than the first thickness of the spacer of the first semiconductor device;
   recessed source and drain regions disposed on either side of the gate structure, wherein the recessed source and drain regions have a top surface recessed below a top surface of the substrate prior to formation of a contact on the recessed source and drain regions.

2. The semiconductor circuit of claim 1, wherein the gate structure of the first semiconductor device has a height greater than that of the gate structure of the second semiconductor device.

3. The semiconductor circuit of claim 1, wherein the raised source and drain regions comprises:
   lightly doped drain regions; and
   deeper more heavily doped regions.

4. The semiconductor circuit of claim 1, wherein the gate structures of the first and second semiconductor device each comprises:
   a gate dielectric layer disposed over the substrate; and
   a gate electrode disposed over the gate dielectric layer.

5. The semiconductor circuit of claim 1, wherein the spacer of the first and second semiconductor devices each comprises:
   a shaped oxide layer over the gate structure;
   a shaped nitride layer over the oxide layer.

6. The semiconductor circuit of claim 1, wherein the spacers of the first and second semiconductor devices are L-shaped.

7. A semiconductor circuit, comprising:
   a first semiconductor device in a substrate, the first semiconductor device comprises:
   a gate structure;
   a spacer disposed on sidewalls of the gate structure, the spacer having a first thickness;
   raised source and drain regions disposed on either side of the gate structure;
   a second semiconductor device in the substrate and electrically isolated from the first semiconductor device, the second semiconductor device comprises:
   a gate structure;
   a spacer disposed on sidewalls of the gate structure, the spacer having a second thickness less than the first thickness of the spacer of the first semiconductor device;
   recessed source and drain regions disposed on either side of the gate structure,
   wherein the spacer of the first semiconductor device comprises:
   a liner oxide layer;
   a nitride layer over the liner oxide layer;
   a first oxide layer over the nitride layer; and
   a second oxide layer over the first oxide layer.

8. A semiconductor circuit, comprising:
   a first semiconductor device in a substrate, the first semiconductor device comprises:
   a gate structure;
   a spacer disposed on sidewalls of the gate structure, the spacer having a first thickness;
   raised source and drain regions disposed on either side of the gate structure;
   a second semiconductor device in the substrate and electrically isolated from the first semiconductor device, the second semiconductor device comprises:
   a gate structure;
   a spacer disposed on sidewalls of the gate structure, the spacer having a second thickness less than the first thickness of the spacer of the first semiconductor device;
   recessed source and drain regions disposed on either side of the gate structure, wherein the spacer of the second semiconductor device comprises:
   a liner oxide layer;
   a nitride layer over the liner oxide layer; and
   an oxide layer over the nitride layer.

9. The semiconductor circuit of claim 1, wherein the spacer of the first and second semiconductor device comprises:
   a liner oxide layer; and
   a nitride layer over the liner oxide layer.

10. A semiconductor circuit, comprising:
    a first semiconductor device in a substrate, the first semiconductor device comprises:

a gate structure;

a spacer disposed on sidewalls of the gate structure, the spacer having a first thickness;

raised source and drain regions disposed on either side of the gate structure;

a second semiconductor device in the substrate and electrically isolated from the first semiconductor device, the second semiconductor device comprises:

a gate structure;

a spacer disposed on sidewalls of the gate structure, the spacer having a second thickness substantially equal to the first thickness of the spacer of the first semiconductor device;

recessed source and drain regions disposed on either side of the gate structure, wherein the recessed source and drain regions have a top surface recessed below a top surface of the substrate prior to formation of a contact on the recessed source and drain regions.

11. The semiconductor circuit of claim 10, wherein the gate structure of the first semiconductor device has a height greater than that of the gate structure of the second semiconductor device.

12. The semiconductor circuit of claim 10, wherein the raised source and drain regions comprises:

lightly doped drain regions; and deeper more heavily doped regions.

13. The semiconductor circuit of claim 10, wherein the gate structures of the first and second semiconductor device each comprises:

a gate dielectric layer disposed over the substrate; and a gate electrode disposed over the gate dielectric layer.

14. The semiconductor circuit of claim 10, wherein the spacer of the first and second semiconductor devices each comprises:

a shaped oxide layer over the gate structure;

a shaped nitride layer over the oxide layer.

15. The semiconductor circuit of claim 10, wherein the spacers of the first and second semiconductor devices are L-shaped.

* * * * *